United States Patent [19]

Komamura

[11] Patent Number: 5,497,154
[45] Date of Patent: Mar. 5, 1996

[54] DITHER GENERATING APPARATUS

[75] Inventor: Mitsuya Komamura, Tsurugashima, Japan

[73] Assignee: Pioneer Electronic Corporation, Tokyo, Japan

[21] Appl. No.: 296,132

[22] Filed: Aug. 26, 1994

[30] Foreign Application Priority Data

Aug. 31, 1993 [JP] Japan .................................. 5-216678

[51] Int. Cl.[6] .................................................. H03M 1/08
[52] U.S. Cl. ............................................................ 341/131
[58] Field of Search ................................... 341/131, 144, 341/155, 200

[56] References Cited

U.S. PATENT DOCUMENTS 5,333,262  7/1994  Ulichney .................................. 395/164

*Primary Examiner*—Brian K. Young
*Attorney, Agent, or Firm*—Sughrue, Mion, Zinn, Macpeak & Seas

[57] ABSTRACT

A dither generating apparatus which generates a sufficiently random auto dither even for a small-level signal and even if the buffer length is short. The LSB of quantized data is extracted and is stored in a buffer memory which serves as an M-bit shift register. An index buffer storing old $2^M$ indexes is referred to with the M bits. A look-up table, which outputs a random value, is referred to in accordance with the value in the index buffer and outputs a dither. After the reference to the look-up table, current M-bit data is input to the index buffer so that the content of the index buffer is shifted piece by piece. As the values of the outputs of the index buffer and the buffer memory are both always variable, different values are always supplied to the look-up table, which therefore generates sufficiently random dithers.

1 Claim, 23 Drawing Sheets

$$\begin{pmatrix} f = 1 \text{ kHz} \\ \text{amp} = 64 \\ \Delta = 32 \end{pmatrix}$$

TRIANGULAR pdf $$\begin{pmatrix} f = 1\,kHz \\ amp = 15 \\ \Delta = 32 \end{pmatrix}$$

$\begin{pmatrix} f = 1\,kHz \\ amp = 4 \\ \Delta = 32 \end{pmatrix}$ $$\begin{pmatrix} f = 1\,kHz \\ amp = 4 \\ \triangle = 32 \end{pmatrix}$$

(SOLID LINE : BEFORE SUBTRCTION
BROKEN LINE : AFTER SUBTRCTION)

$$\begin{pmatrix} f = 1\,kHz \\ amp = 2 \\ \Delta = 32 \end{pmatrix}$$

$\begin{pmatrix} \text{amp} = 4 \\ \Delta = 32 \end{pmatrix}$

FIG.24

| STIMULUS NO. | QUANTIZED BIT NUMBER | NOISE SHAPING CHARACTERISTIC | DITHER | NO. OF DRAWING |
|---|---|---|---|---|
| 0 | 16($\Delta=1$) | × | × | FIG.15 |
| 1 | 14($\Delta=4$) | × | × | FIG.16 |
| 2 | 11($\Delta=32$) | SBM | × | FIG.17 |
| 3 | 11($\Delta=32$) | SBM | TRIANGULAR AUTO | FIG.18 |
| 4 | 11($\Delta=32$) | SBM | TRIANGULAR AUTO WITH SUBTRACTION | FIG.19 |
| 5 | 11($\Delta=32$) | MAF | TRIANGULAR AUTO | FIG.20 |
| 6 | 11($\Delta=32$) | MAF | TRIANGULAR AUTO WITH SUBTRACTION | FIG.21 |

BLOCK DIAGRAM OF SUPER BIT MAPPING

SOUND SOURCE 1

SOUND SOURCE 2

HORIZONTAL SCALE: STIMULUS NUMBER
VERTICAL SCALE: EVALUATION NUMBER 5,497,154

DITHER GENERATING APPARATUS

BACKGROUND OF THE INVENTION

1. Field of the Invention

The present invention relates to a dither generating apparatus, and more particularly, to an improvement on an auto dither circuit.

2. Description of the Related Art

In the filed of digital audio, there recently is a trend of higher quality sounds, by the demand of reproducing sounds which are of a very high fidelity with original sounds. Specifically, the use of 16 bits as the quantization bits for a CD (Compact Disk), a DAT (Digital Audio Tape-recorder) and the like is considered to provide an insufficient dynamic range. Ideally, about 20 bits are required for the quantization bits. Since the CD and DAT are very popular in these days, it is however difficult to propose an entirely new format. Consequently, a sufficient dynamic range should be secured while the compatibility with the existing 16-bit format is maintained.

The scheme of adding a dither to improve the quantization characteristic is known as a means of securing the dynamic range. A dither is added at the time a signal is recorded, in order to transform the quantization noise, which occurs at the time of digital conversion, to white noise, thus ensuring the reproduction of a signal with a smaller amplitude than one quantization step of the system. This substantially provides the same effect as increasing the dynamic range. Since one purpose for adding a dither is to transform the quantization noise to white noise, it simply means that noise is added. In other words, a record signal contains noise that was not included in the original signal. To remove the dither-oriented noise from a reproduction signal, quite the same dither should be generated both at the time of signal recording and at the time of signal reproduction and the dither should be subtracted from the reproduction signal in the signal reproduction.

As one way of generating a dither, an auto dither generating system, which generates a dither using digital audio data itself, has been proposed.

The auto dither generating system generates a dither using digital audio data and allows the same digital audio data to be shared by both the recording side and the reproducing side. It is therefore possible to generate the same dither and subtract it from the reproduction signal without timing data.

While the characteristic of the conventional auto dither raises no problems when the signal level is sufficiently high, the LSB (Least Significant Bit) becomes almost the same value when the signal level becomes lower, and a change in the value in use in a look-up table 9 decreases. Accordingly, the level of the signal that is to be added to an input signal Si becomes constant. As a result, the dither is no longer white noise and undesirably becomes input-correlative noise.

Let us now consider a more desirable dither characteristic. The dither characteristic should be analyzed in terms of a probability density function. First, in view of the linearization of the transfer characteristic, there are a rectangular dither whose probability density function forms a rectangular distribution chart and a triangular dither whose probability density function forms a triangular distribution chart. Secondly, the triangular dither is said to be excellent theoretically due to its characteristic having no noise modulation at the time of conversion.

If the buffer memory length or buffer length is short, there involves a problem that the triangular dither may not have a sufficient amplitude distribution.

OBJECT AND SUMMARY OF THE INVENTION

It is therefore an object of the present invention to provide an auto dither generating apparatus which can generate a sufficiently random auto dither even for a small-level signal and even if the buffer memory length is short.

To achieve the above object, according to one aspect of this invention, there is provided a dither generating apparatus which comprises: extracting means for sequentially extracting a specific bit of each quantized digital data; first memory means for storing M (M: a natural number) pieces of specific bits newly extracted by the extracting means, and shifting data associated with the specific bit, stored early, bit by bit every time a new specific bit is input; second memory means for storing $2^M$ pieces of first M-bit data consisting of the M specific bits stored in the first memory means, and shifting the first M-bit data, stored early, piece by piece every time the first M-bit data is input; and third memory means for storing $2^M$ random values in a row and outputting the random values as dithers for second M-bit data input from the second memory means, wherein a value of the first M-bit data is input data stored in the second memory means and one piece of data from the stored $2^M$-bit data is used as an address for calling the second M-bit data.

According to the present invention, LSB extracting means extracts the LSB of data after quantized by a quantizer, and a buffer memory, which is the first memory means and serves as a shift register, stores the LSB. Up to this point is the same as the prior art. A look-up table is not referred directly with an M-bit index in this invention. The look-up table, which is the third memory means that output random values, is referred to via an index buffer which is the second memory means storing old $2^M$ indexes. In other words, given that N is the current value in the buffer memory, the N-th value in the index buffer, $I_N$ is supplied to the look-up table, and a random number is output as a dither by referring to this look-up table. After the reference to the look-up table, the value of the current index, N, is input to the index buffer and the content of the index buffer is shifted piece by piece.

Every time the LSB is input to the buffer memory, therefore, the value output from the buffer memory changes, altering the address in the index buffer which is to be referred to. Further, the content of the index buffer itself serves as a table whose elements have variable values, so that different values are always supplied to the look-up table. Sufficiently random dithers are therefore produced from the look-up table.

BRIEF DESCRIPTION OF THE DRAWINGS

FIG. 24 is a correlation table showing stimuli used in experiments and the diagram numbers;

DETAILED DESCRIPTION OF THE PREFERRED EMBODIMENTS

Figure 1:
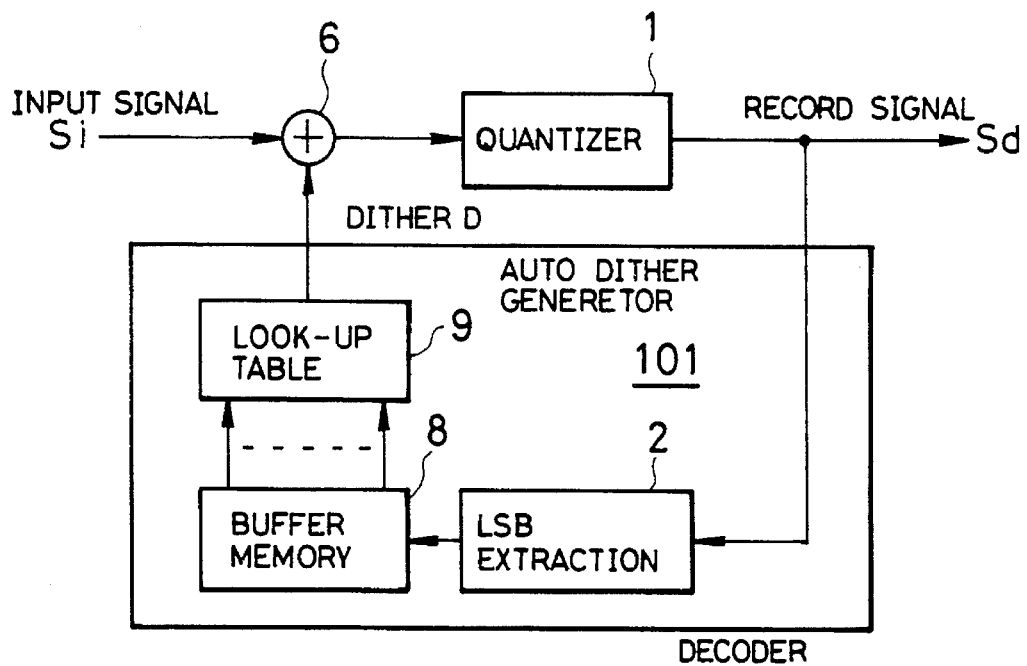
FIGS. 1 and 2 are explanatory diagrams illustrating the structures of a coder and a decoder which use a conventional auto dither.

Before entering into the detailed description of embodiments, a conventional auto dither generator will be described referring to the accompanying drawings. FIG. 1 exemplifies the conventional auto dither generator. At the time of signal recording, a quantizer 1 in a coder shown in FIG. 1 converts an input signal Si, which has a greater number of bits than the number of bits, B, limited by the recording format, into B-bit digital data and outputs the resultant data as a record signal Sd. In an auto dither generator 101, the LSB's of old M data samples to which dithers have already been added for quantization are extracted by an LSB extractor 2 and are stored in a buffer memory 8. The value of the M bits is added as an index (reference value) to a look-up table 9 which has $2^M$ values arranged at random. The look-up table employs a random value table which contains random values that have no correlation with an input address. The look-up table 9 is a conversion table which generates so-called white noise from an input value that varies regularly, the white noise having no correlation with the input value. With respect to the M-bit input value, the look-up table 9 refers to $2^M$ values to generate an M-bit dither. This M-bit dither is added to the input signal Si by an adder 6.

Figure 2:
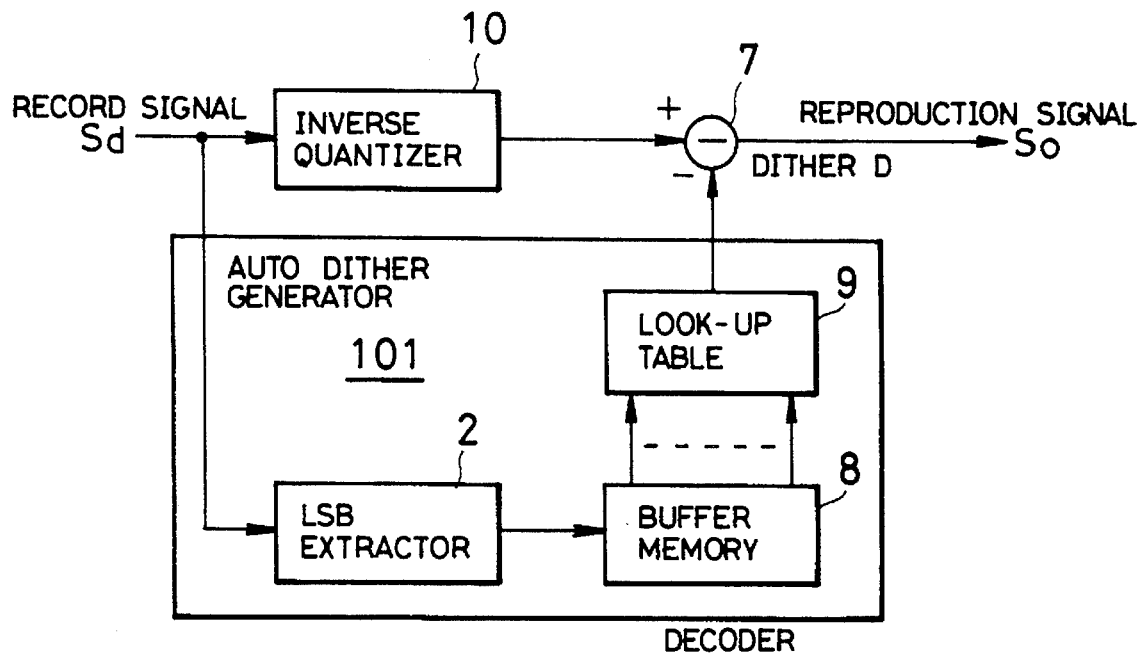

At the time of signal reproduction, a decoder shown in FIG. 2 generates a dither in a similar manner using the LSB's of old M data samples of the record signal Sd. A subtracter 7 subtracts this dither from the result of inverse quantization done by an inverse quantizer 10, thus yielding a reproduction signal So with suppressed noise.

As the auto dither is generated using only old M data samples which have already been quantized, a correct dither can be generated after M samples even when a code error occurs or when reproduction starts from a midway.

Figure 3:
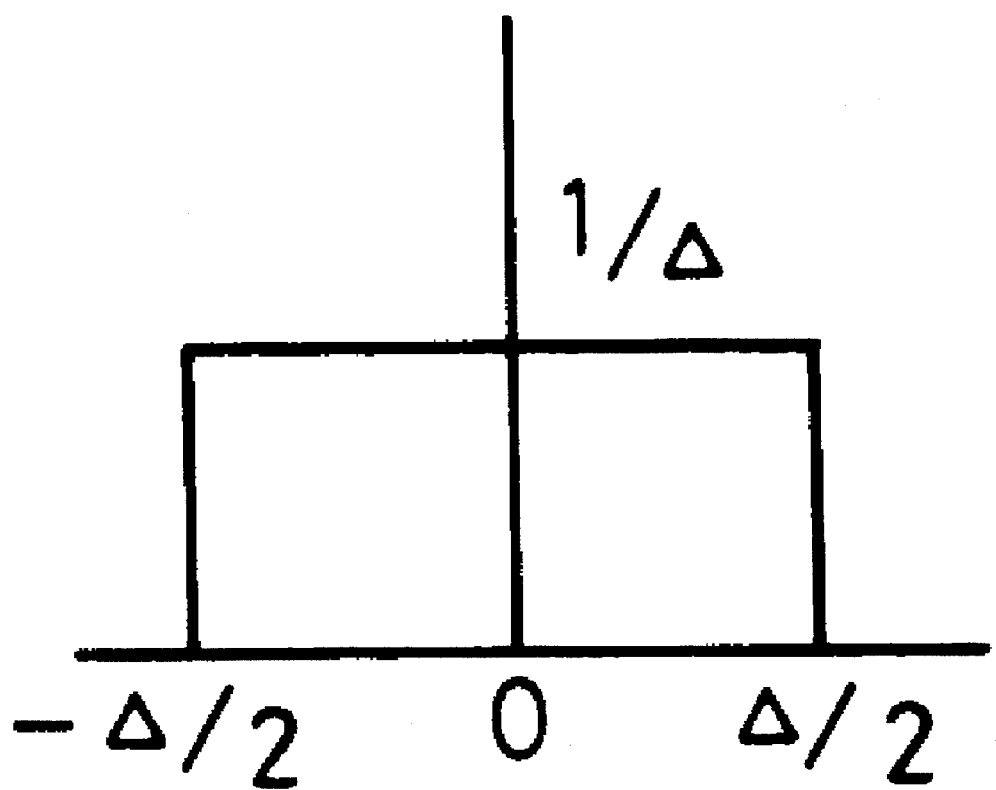
FIG. 3 is an explanatory diagram showing the probability density function of a rectangular dither.

The characteristic of the conventional auto dither will now be discussed with reference to FIGS. 3 through 5.

When the signal level is sufficiently high as compared with the quantization step, 0 and 1 appear on the LSB's of the quantized data samples at random, so that the value of an M-bit index is a random number. As the look-up table 9 is referred to with a random index, it generates a dither that has no correlation with an input signal. Given that the quantization step is A (corresponding to the LSB), if the values of the elements in the look-up table 9 are distributed uniformly from $-\Delta/2$ to $\Delta/2$, the probability density function (pdf) pr(v) of the dither is given by an equation 1. This probability density function is of a rectangular type which is uniformly distributed from $-\Delta/2$ to $\Delta/2$, as shown in FIG. 3. The effective value $v_r$ of the dither is computed by an equation 2.

$$Pr(v) = \begin{cases} \frac{1}{\Delta} & \left(-\frac{\Delta}{2} > v > \frac{\Delta}{2}\right) \\ 0 & \left(|v| > \frac{\Delta}{2}\right) \end{cases} \quad (1)$$

$$vr = \sqrt{\int_{-\infty}^{\infty} v^2 pr(v) dv} = \sqrt{\int_{-\frac{\Delta}{2}}^{\frac{\Delta}{2}} v^2 \frac{1}{\Delta} dv} = \sqrt{\frac{\Delta^2}{12}} \quad (2)$$

As mentioned earlier, while the characteristic of the conventional auto dither raises no problems when the signal level is sufficiently high, the LSB (Least Significant Bit) becomes almost the same value when the signal level becomes lower, and a change in the value in use in a look-up table 9 decreases. Accordingly, the level of the signal that is to be added to an input signal Si becomes constant. As a result, the dither is no longer white noise and undesirably becomes input-correlative noise.

A triangular dither will now be considered.

Figure 6:
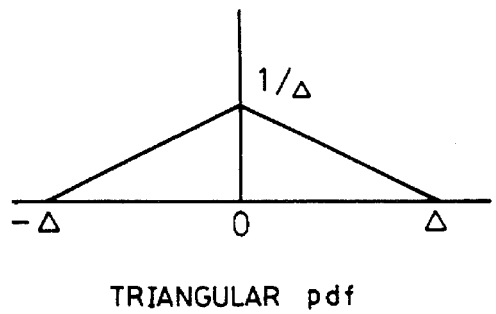
FIG. 6 is an explanatory diagram showing the probability density function of a triangular dither.

The characteristics of a triangular dither are expressed by equations 3 and 4 below. The equation 3 shows the probability density function of the triangular dither, and the equation 4 the amount of an increase in noise. A triangular dither, which is obtained by adding two rectangular dithers, is distributed over a range from $-\Delta$ to $\Delta$ with an average of 0 and a variance of $\Delta^2/6$ (see FIG. 6).

$$pt(\upsilon) = \begin{cases} -\frac{1}{\Delta^2}|\upsilon| + \frac{1}{\Delta} & \left(-\frac{\Delta}{2} < \upsilon < \frac{\Delta}{2}\right) \\ 0 & \left(|\upsilon| > \frac{\Delta}{2}\right) \end{cases} \quad (3)$$

$$\upsilon t = \sqrt{\int_{-\Delta}^{\Delta} \upsilon^2 pt(\upsilon)d\upsilon} \quad (4)$$

$$= \sqrt{2\int_0^{\Delta} \upsilon^2 \left(-\frac{1}{\Delta^2}\upsilon + \frac{1}{\Delta}\right)d\upsilon}$$

$$= \sqrt{\frac{\Delta^2}{6}}$$

Conventionally, a triangular dither is produced buffer memory are divided by two to obtain two indexes consisting of M/2 bits. Two look-up tables each having $2^{M/2}$ values are referred to with those indexes, respectively. Each look-up table generates a rectangular dither having a distribution from $-\Delta/2$ to $\Delta/2$ (see FIG. 3). Those rectangular dithers are added together to yield a triangular dither (see FIG. 6).

Figure 4:
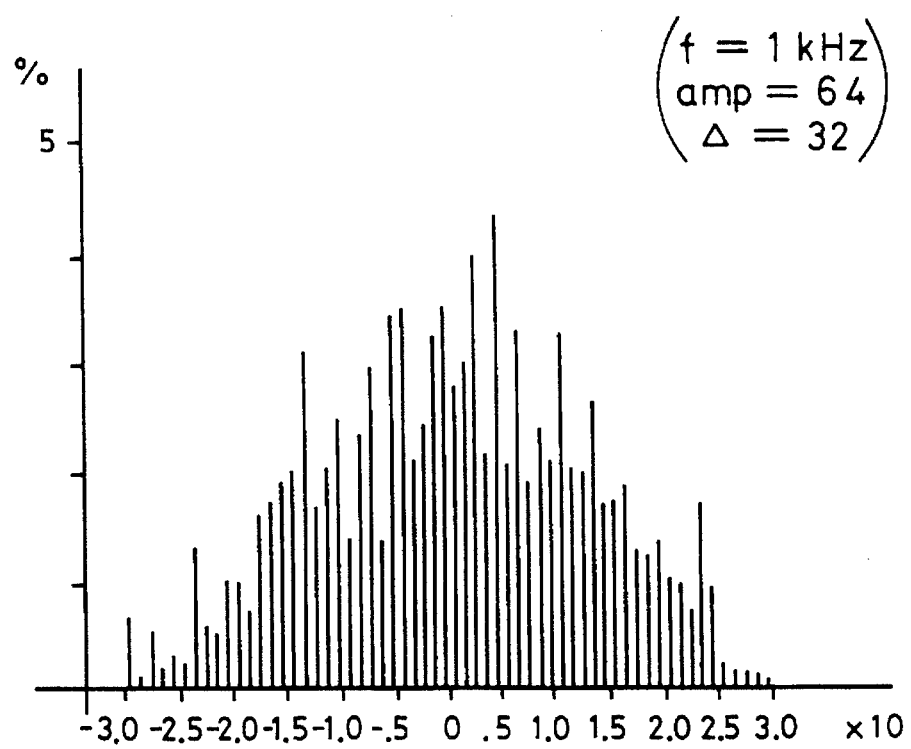
FIGS. 4 and 5 are characteristic charts showing the amplitude distribution and spectrum of the conventional auto dither.
Figure 5:
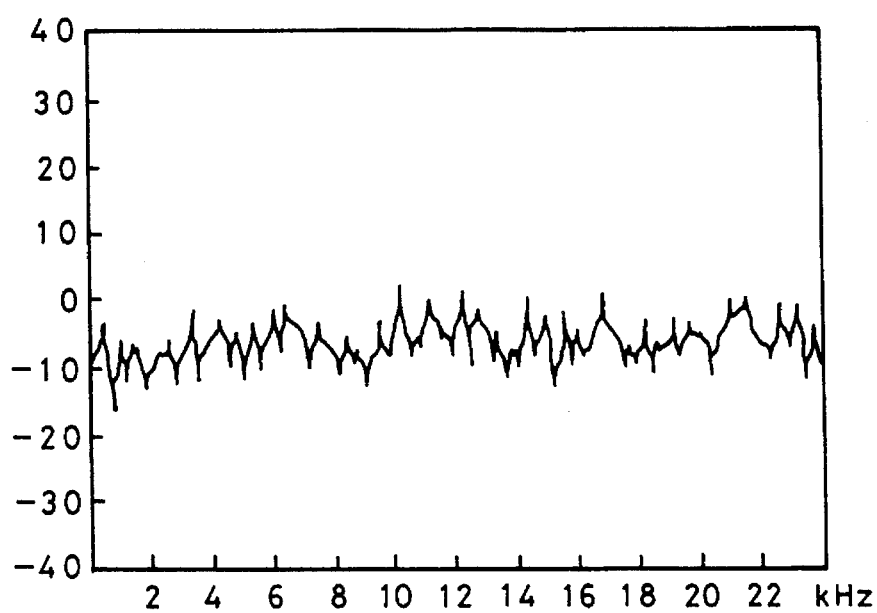

Simulating the performance of the conventional triangular dither obtained by auto dithers yielded an amplitude distribution shown in FIG. 4 and a spectrum chart shown in FIG. 5. In FIGS. 4 and 5, M is 16 and it is divided into upper 8 bits and lower 8 bits, which are used as two indexes to refer to two look-up tables each having $2^8=256$ values arranged at random, thereby generating a triangular dither.

It is apparent from FIGS. 4 and 5 that it is hardly a triangular probability density function in the amplitude distribution and the spectrum is not white, so that the dither cannot be used directly. To overcome this shortcoming, the buffer length should be increased to increase the number of bits in each index so that the look-up tables can be referred to more randomly. If, with M=32, two look-up tables are referred to with two indexes each consisting of 16 bits, each look-up table should have elements of $2^{16}$ words (word: 16 bits), requiring a vast memory capacity. As about 8 bits are suffice for the number of bits of a dither, 16 bits (one word) are wasteful. From the above, it is not so easy to achieve the object of generating random dithers even for a small-level signal using a buffer having a length of about 8 bits.

In the following, description will made with reference to the accompanying drawings on dither generating apparatuses as preferable embodiments of the present invention. The discussions of the characteristics hereunder are basically based on the results of the simulation with a frequency of 1 kHz and a quantization step $\Delta=32$ unless otherwise specified.

First Embodiment

A first embodiment of the present invention is an auto dither generator which refers to a look-up table twice to provide a theoretical random noise distribution.

Figure 7:
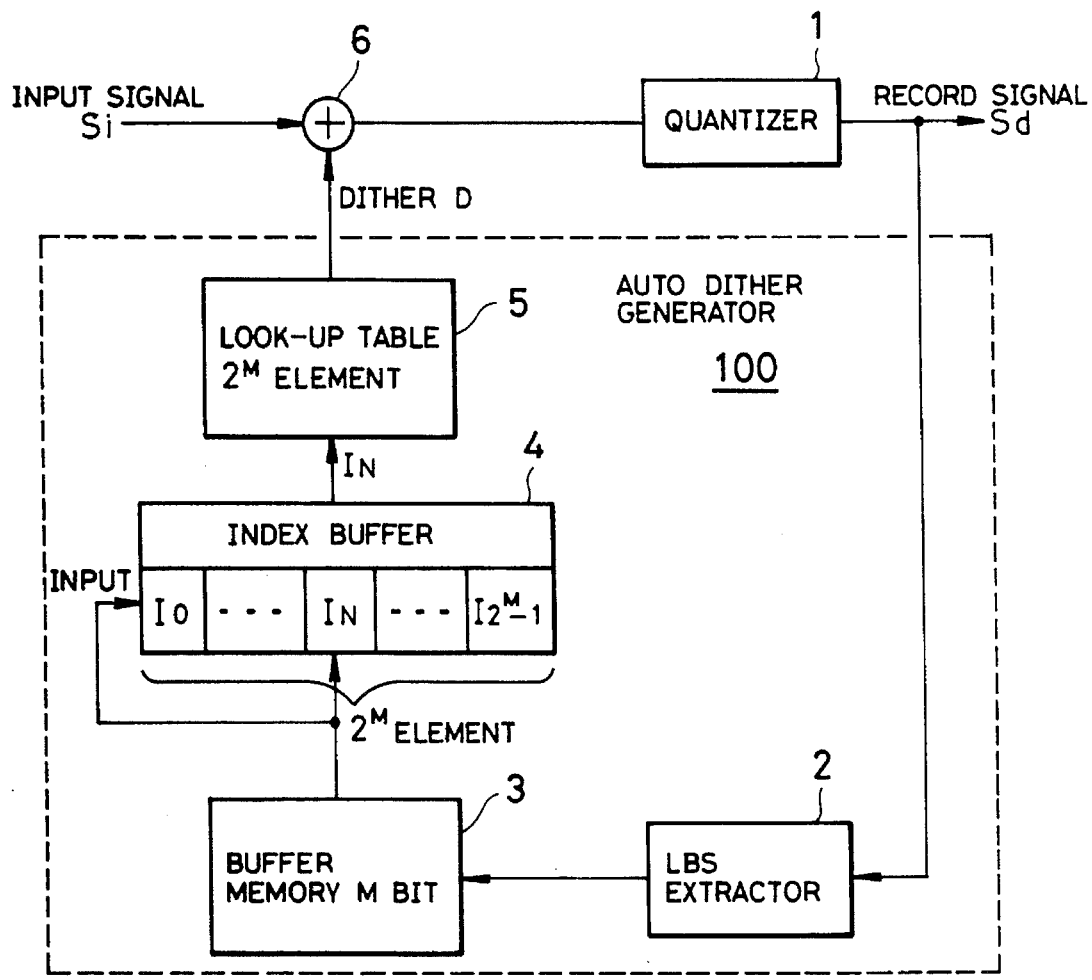
FIG. 7 is a block diagram illustrating an auto dither generating apparatus according to the present invention.

The constitution of the first embodiment is illustrated in FIG. 7. The feature of the first embodiment lies in that an index buffer 4, which is not provided in the conventional auto dither generator, is located inside an auto dither generator 100 in FIG. 7. For the sake of convenience, data consists of arbitrary M (e.g., 16) bits.

An input signal Si, which is a digital signal having more bits than the number of bits, B, of a record signal, is sent via an adder 6 to a quantizer 1 to be converted to a B-bit digital signal. This digital signal is input to an LSB extractor 2 which extracts the LSB of the digital signal that is input to a buffer memory 3. The buffer memory 3 has a length of M bits and is constituted of a typical M-bit shift register. The buffer memory 3 may also be constituted by the combination of general-purpose shift registers that provides the necessary M bits, or may be constituted by coupling flip-flops in M stages. The output, N, of the buffer memory 3 is distributed to two ways, both supplied to an index buffer 4. This index buffer 4 also has a shift-register like structure. More specifically, the index buffer 4 is designed to receive an M-bit value as a memory address and output M-bit data at the location specified by that address. The data given as the address is also input as M-bit data $I_0$. This M-bit data is shifted every time new data is input to the index buffer 4; for example, $I_0$ becomes $I_l$. Data $I_N$ in the index buffer 4 is the data that has been input N times earlier, and is output from the index buffer 4 when an address N is given.

The output $I_N$ of this index buffer 4 is input to a look-up table 5, which in turn generates a dither corresponding to the output $I_N$. The dither is then added to the input signal Si by the adder 6.

To generate a triangular dither, two random outputs should be generated simultaneously and should be added to the input signal Si by the adder 6. In other words, this object can be achieved by providing two auto dither generators 100 and inputting the LSB of lower M/2 bits of the M bits to one auto dither generator 100 while inputting the LSB of upper M/2 bits to the other. (For M =16, 16 bits are divided to upper 8 bits and lower 8 bits.)

The operation of the first embodiment will be described below.

The input signal Si is digital data having more bits than the number of bits B of a record signal. This input signal Si is converted to a digital signal consisting of B bits by the quantizer 1. The result of the conversion is output as a record signal Sd to a recording apparatus, such as a CD or DAT. The B-bit record signal Sd is input to the LSB extractor 2, which in turn extracts data of its LSB. This extraction is accomplished simply by passing LSB data of the B bits on the output line of the quantizer 1, and a simple data buffer suffices for this job when the timing should be matched. This LSB takes a value of digital "1" or "0" and is supplied to the buffer memory 3 in synchronism with an unillustrated system clock or the like.

The buffer memory 3 shifts the content by one bit every time new LSB data is input. That is, when M pieces of data are input (when shifting is executed for M samples), the latest input data is shifted out of the MSB (Most Significant Bit) of the buffer memory 3. The M-bit data in the buffer memory 3 therefore carries LSB data for earlier M samples.

The M-bit data of the buffer memory 3 is transferred directly to the index buffer 4. If the M-bit data is N, data $I_N$ located at the N-th buffer position in the index buffer 4 is selected and is output therefrom as another M-bit data. At the same time, the same N is supplied to the input terminal of the index buffer 4 and is latched into the index buffer 4 in synchronism with the next system clock. That is, the data N at the input terminal becomes the first data $I_0$. Upon reception of N, the index buffer 4 shifts the content by one piece of data so that, for example, the N-th data $I_N$ becomes (N+1)-th data. The index buffer 4 therefore receives N as the address and input data and outputs M-bit data (i.e., the value of the buffer memory 3 that has been input N times earlier). In other words, the index buffer 4 is a memory which has $2^M$ pieces of M-bit data.

The value $I_x$, which is specified by N and has been input N times earlier, becomes the next input data for the look-up table 5. This look-up table 5 has $2^M$ elements and contains random numbers to generate white nose. The look-up table 5 outputs, as a final output dither D, a random value stored in the element whose address is specified by the input value $I_x$. This dither D is added to the input signal Si by the adder 6.

In generating a triangular dither, another auto dither generator of the same type as the auto dither generator 100 should be provided so that the LSB of the upper M/2 bits and the LSB of the lower M/2 bits are respectively input to the two auto dither generators 100, and two dithers D should be added to the input signal Si by the adder.

In signal reproduction, the dither is generated from the record signal by the auto dither generator in the same manner as carried out by the conventional auto dither generator, and is subtracted from the output of an inverse quantizer by a subtracter, yielding a reproduction signal which contains no dither-oriented noise. More specifically, if a circuit equivalent to the auto dither generator 100 in FIG. 7 is provided in the reproducing apparatus, the LSB of a reproduced digital audio signal (record signal Sd) is input to the buffer memory 3. Accordingly, M-bit data is generated from the buffer memory 3 in the same sequence and in the same quantity as is done on the recording side, so that the generated dither D is the same as the one obtained at the time of signal recording. If this dither D is subtracted from the output signal of the inverse quantizer by the subtracter, the proper reproduction signal can be obtained.

For a triangular dither, the M bits should be divided to upper M/2 bits and lower M/2 bits as done in the signal recording to attain two dithers and those two dithers should simultaneously be subtracted from the output signal of the inverse quantizer by the subtracter.

Figure 8:
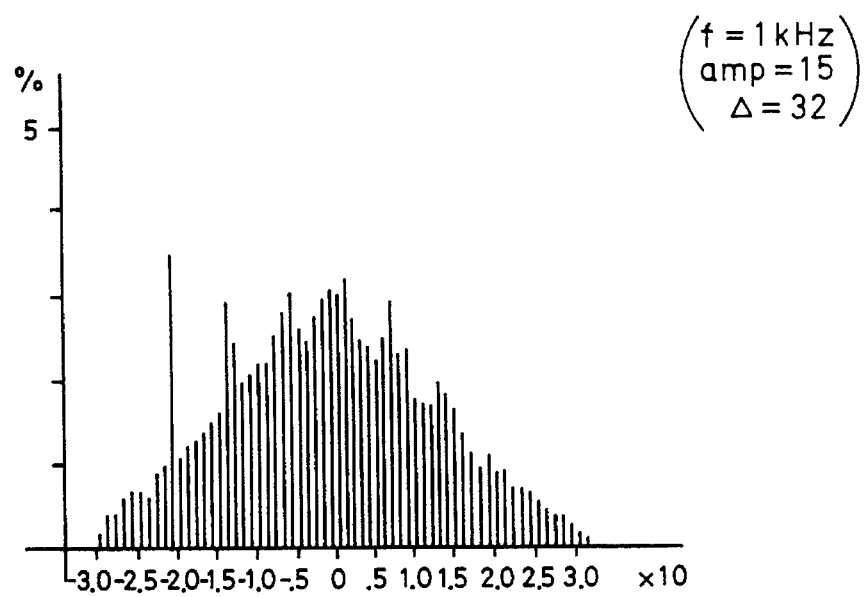
FIGS. 8, 9 and 10 are characteristic charts showing the amplitude distribution and spectrum of an auto dither according to this invention.
Figures 9, 10:
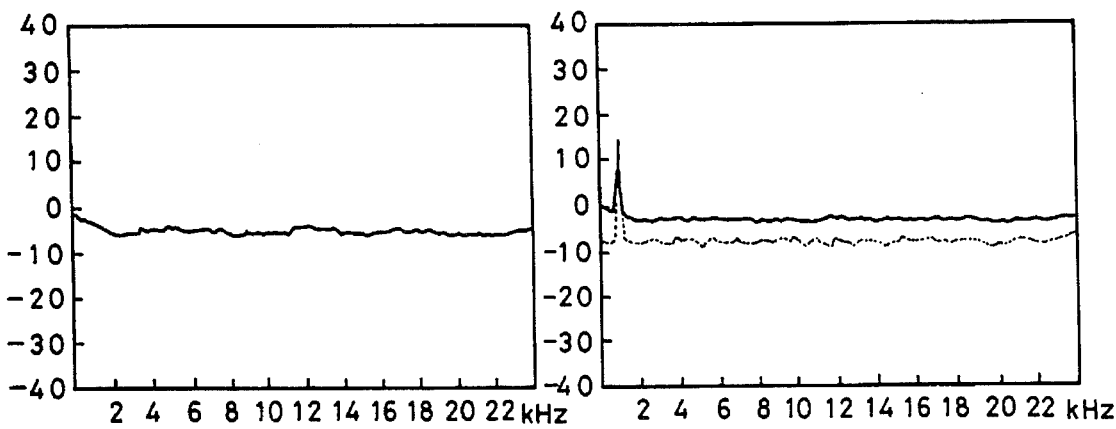

The output results of the triangular dither produced by the first embodiment are illustrated in FIGS. 8 through 10. Those characteristics will be compared with the characteristics (see FIGS. 4 and 5) of the conventional triangular dither obtained by dividing a single auto dither into two and then adding them to the input signal. FIGS. 4 and 5 show characteristics obtained with an ordinary signal level of 64 (amplitude: amp=64) whereas FIGS. 8 through 10 show characteristics obtained with a signal level of 15 (amp=15).

FIG. 8 presents the amplitude distribution of an auto dither according to the first embodiment, which is excellent and is close to the theoretical distribution, whereas FIG. 4 shows the amplitude distribution of a dither that is obtained using the conventional auto dither generator. The latter distribution has a considerably broken triangular shape.

FIG. 9 shows the spectrum distribution of the dither, which is a very flat waveform showing that white noise is sufficiently generated. FIG. 5 illustrates the spectrum of the conventional auto dither, which shows a frequency dependency and is not thus practical.

According to the first embodiment, even when the input signal Si has a small signal level lower than the quantization step and a sequence of the LSB's mostly contain "0", the address of the index buffer 4 that is referred by the buffer memory 3 changes greatly sample by sample (the number is doubled by a 1-bit shift) if any of the M bits takes a value of "1".

Accordingly, different data is output from the index buffer 4 each time, thus allowing the look-up table 5 to generate a dither which is a sufficiently random number. It is therefore possible to provide a clear triangular dither whose characteristic is close to the theoretical one.

FIG. 10 shows spectra obtained by quantizing a 1 kHz sine wave having an amplitude of 15 with an auto dither. In the diagram, the solid line shows the spectrum before subtraction and the broken line the spectrum after subtraction. It is apparent that the quantization noise is white noise and a signal whose level is smaller than the quantization step is reproduced with a good resolution.

Second Embodiment

As illustrated in the foregoing description of the first embodiment, with a dither added, the transfer characteristic of the quantizer is linearized, the quantization noise becomes white noise, and a signal whose level is smaller than the quantization step can be reproduced. Even though the dither is subtracted from the output signal on the reproducing side, quantization noise of $\sqrt{(\Delta^2/12)}$ (effective value) is still present.

In the second embodiment, noise shaping, a scheme to improve the audio characteristic, is employed in the auto dither generator of this invention to modify the spectrum of quantization noise in accordance with a minimum audible threshold value, thus reducing audible noise.

To begin with, the basic operation involving noise shaping will be described with reference to FIGS. 11 through 13. This scheme is effective in converting an original signal, which has multiple bits at the time of recording, into a signal with fewer bits than is specified by the recording format.

Figure 11:
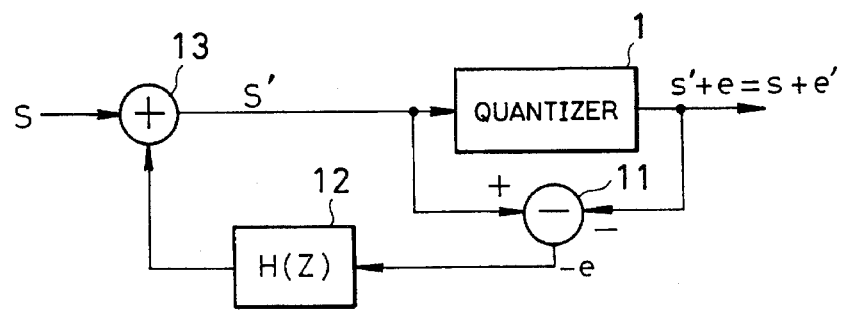
FIGS. 11, 12 and 13 are explanatory diagrams showing noise shaping quantization.

As shown in FIG. 11, at the time an original signal S is re-quantized, quantization noise is fed back via a filter H(Z) 12. The quantization noise is shaped with 1-H(Z) through the feedback.

Given that the input signal is S, the quantization noise is e and the quantization noise after shaping is e', their relation is expressed by the following equation 5.

$$S'(Z)=S(Z)+e'(Z)-e(Z)=S(Z) H(Z)e(Z)$$

Rearranging the above equation yields $$e'(Z)=[1-H(Z)]e(Z)$$

Let $Z=e^{j\omega}$ and substituting it in the above yields $$e'(e^{j\omega})=[1-H(e^{j\omega})]e(e^{j\omega}) \qquad (5)$$

where $|1-He^{j\omega})|$: amplitude characteristic $e(^{j\omega})$: quantization noise.

If the proper dither is added, quantization noise has a flat spectrum, so that the shape of the noise spectrum after shaping reflects the weighting by the absolute value of the amplitude characteristic.

By designing this shaping characteristic to be low in the low and intermediate ranges and high in the high range in accordance with the characteristic of the minimum audible threshold level which a person can hear, the S/N (Signal-to-Noise) ratio in the low and intermediate frequency ranges is improved, thus widening the audible dynamic range. This noise shaping scheme is employed in the present invention to improve the audio characteristic.

The filter H(Z) can be designed from the amplitude characteristic $|1-H(Z)|$ of noise shaping. The transfer function of the noise shaping is expressed by an equation 6 below.

$$1-H(e^{j\omega})=e^{-\alpha(\omega)}e^{-j\theta(\omega)} \qquad (6)$$

where $\alpha(\omega)$ is an attenuation characteristic with neper as a unit, and θ(ω) is a phase characteristic with radian as a unit.

A desirable arbitrary amplitude characteristic is expressed by an equation 7 below.

$$|1-H(w^{j\omega})|=e^{-\alpha(\omega)} \tag{7}$$

As the phase characteristic θ(ω) is obtained through the Hilbert transformation of the attenuation characteristic α(ω), the transfer function is obtained. If this transfer function is subjected to inverse fast Fourier transform (IFFT) to obtain 1−H(Z), the noise shaping filter H(Z) can be attained from 1−H(Z).

Figure 12:
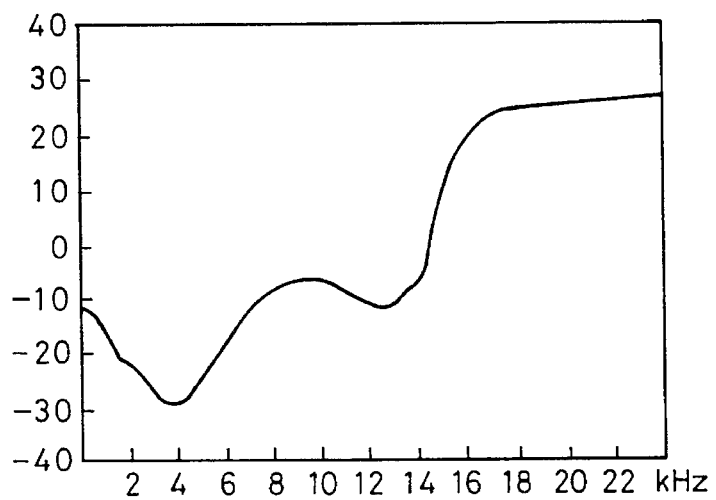
Figure 13:
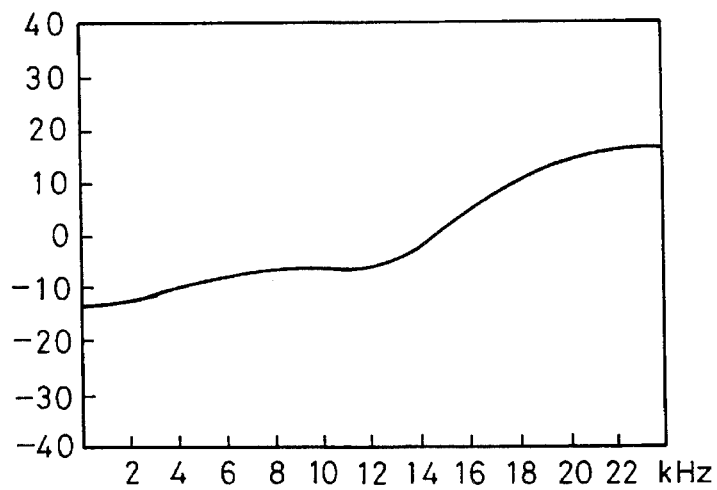

The noise shaping characteristics designed in this manner are illustrated in FIGS. 12 and 13. FIG. 12 shows the noise shaping characteristic using a 32-tap FIR (Finite-duration Impulse Response), which is matched with the minimum audible threshold characteristic. FIG. 13 shows the noise shaping characteristic using a 12-tap FIR, in which the amount of shaping is smaller than that of the noise shaping characteristic in FIG. 12. This embodiment employed the shaping characteristic shown in FIG. 13.

Figure 14:
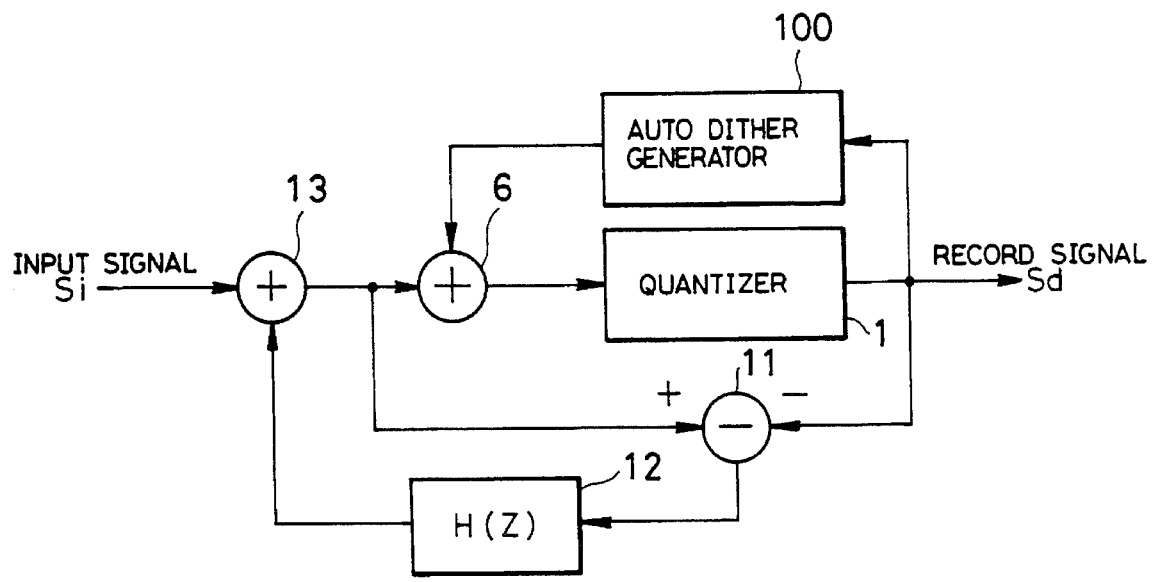
FIGS. 14 and 15 are block diagrams showing a coder and a decoder which employ auto-dither added noise shaping quantization according to a second embodiment.
Figure 15:
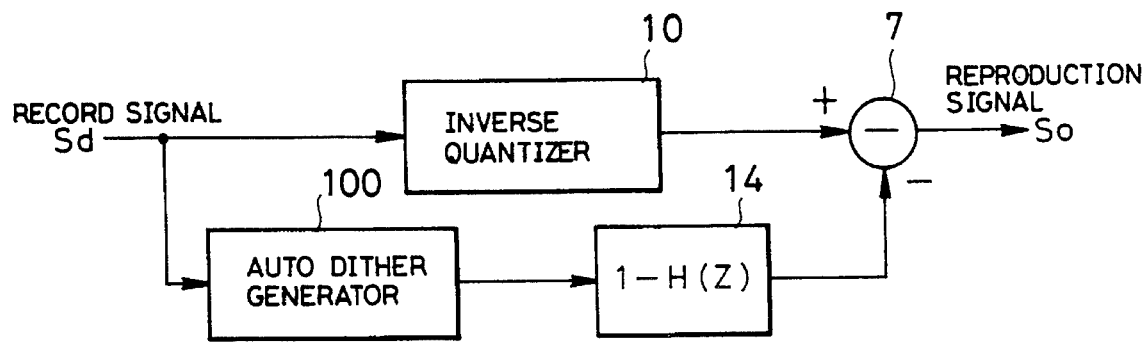

The constitution of the second embodiment is illustrated in FIGS. 14 and 15.

For signal coding, the auto dither generator 100 is the same as the circuit of the first embodiment, and the adder 6, quantizer 1 and auto dither generator 100 constitute an auto dither generating apparatus, as shown in FIG. 14. Noise shaping quantization is executed in the loop in which the output of the dither generating apparatus is subtracted from the input signal by a subtracter 11, the resultant signal is put through the filter H(Z) 12 and fed back to an adder 13 to be added to the input signal Si there.

For signal decoding, the record signal Sd is output as a reproduction signal So via the inverse quantizer 10. The auto dither generator 100 produces a dither from the record signal Sd in the auto dither generator, and this dither is shaped through the filtering with 1−H(Z). The resultant dither is subtracted from the output signal from the inverse quantizer 10 by the subtracter 7.

The operation of the second embodiment is the operation of the auto dither generating apparatus of the first embodiment to which noise shaping described above with reference to FIGS. 11 through 13 is added.

First, the dither is added to the input signal Si and the resultant signal is quantized to yield the record signal Sd through the loop connecting the adder 6, quantizer 1 and auto dither generator 100 in FIG. 14. Then, the quantized signal Sd is subtracted from the input signal Si which is the multiple-bit original signal to yield a quantization noise component. This quantization noise is fed back through the filter 12 for conversion of the frequency component. The resultant white noise component is added to the input signal Si by the adder 13, yielding the record signal Sd that is the shaped quantization noise of the original signal to which a noise component originating from the shaped dither is added.

In the decoder shown in FIG. 15, through the reverse process to the process of the coding, white noise is produced from the record signal Sd by the auto dither generator 100 and is shaped by a 1−H(Z) filter 14, and the resultant signal is subtracted from the inverse-quantized reproduction signal So by the subtracter 7. The resultant reproduction signal So has the noise component so shaped that the noise frequency spectrum is matched with the minimum audible threshold.

The characteristics of the second embodiment are illustrated in FIGS. 16 through 21.

Figure 16:
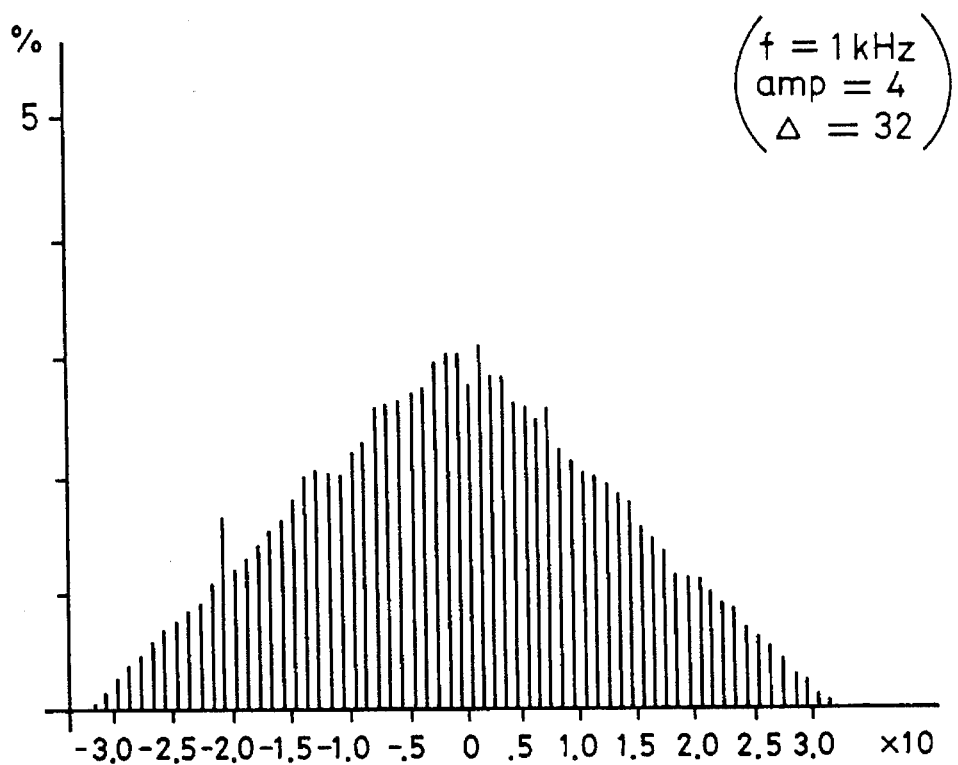
FIGS. 16 and 17 are characteristic charts showing an improved auto dither characteristic (1) of the present invention for a small-level signal.
Figure 17:
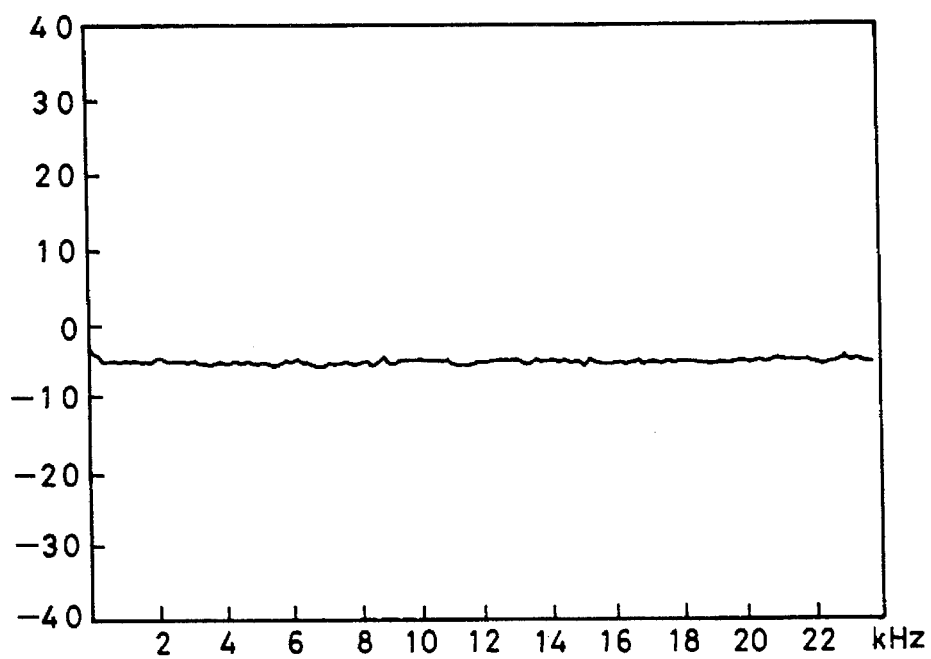
Figure 18:
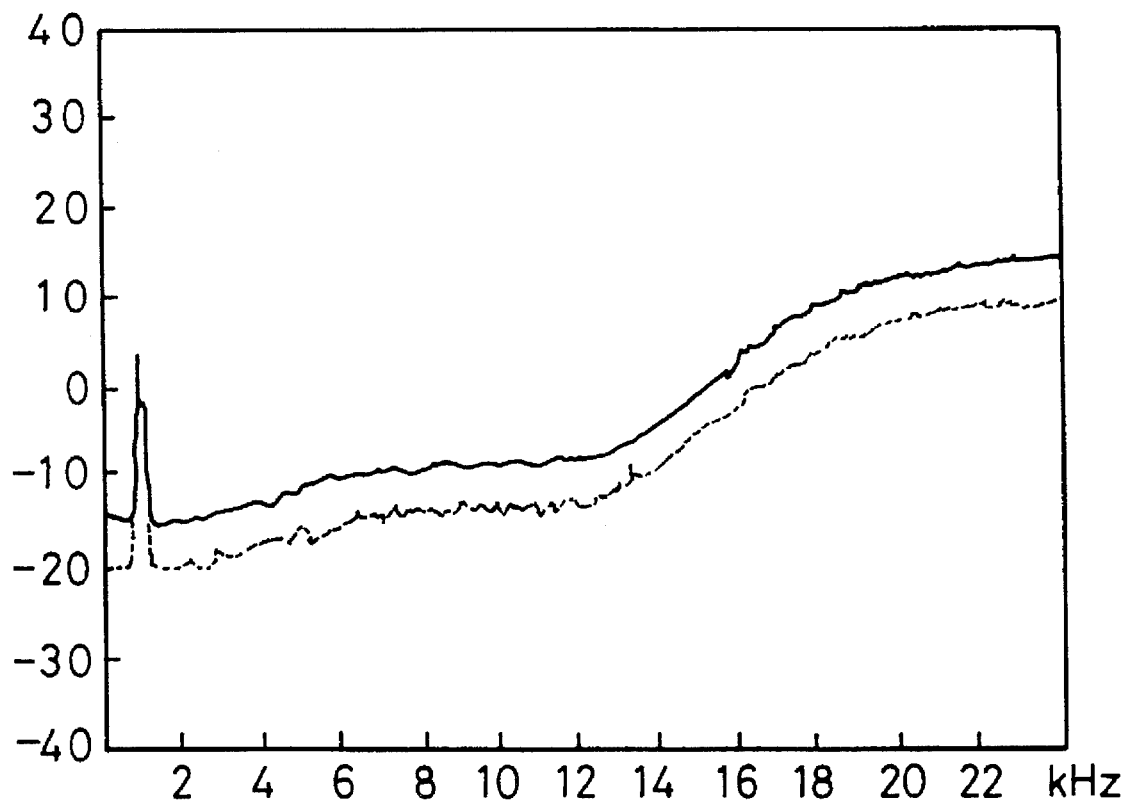
FIG. 18 is a spectrum chart showing a noise shaping quantization characteristic according to the second embodiment.

FIG. 16 shows the characteristic of the auto dither generating apparatus for a small-level signal (amplitude amp= 4); in the first embodiment, the signal has an amplitude in FIGS. 8 to 10. It is apparent from the diagram that the amplitude distribution is a triangular probability density function (pdf). Further, the spectrum distribution in FIG. 17 is that of white noise. Therefore, this signal is suitable for use as a dither. FIG. 18 shows the quantization spectra obtained by quantizing a 1 kHz sine wave having an amplitude of 4 with an auto dither. In the diagram, the solid line shows the spectrum before subtraction and the broken line the spectrum after subtraction. It is apparent from the diagram that the noise shaping is executed properly and the S/N ratio is improved by noise subtraction.

Figure 19:
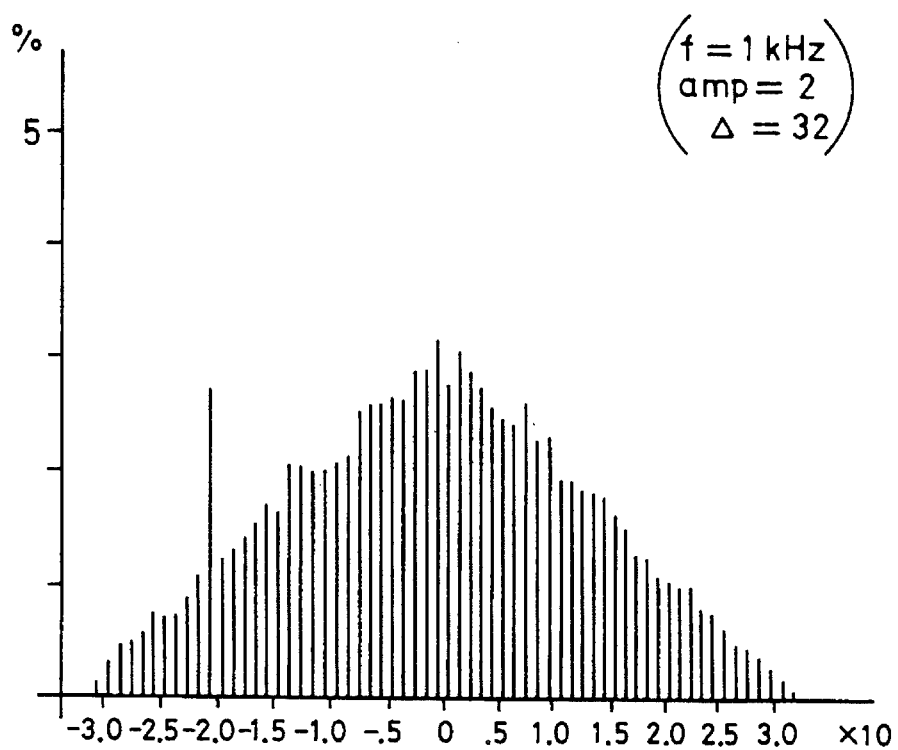
FIGS. 19 and 20 are characteristic charts showing an improved auto dither characteristic (2) of the present invention for a small-level signal.
Figure 20:
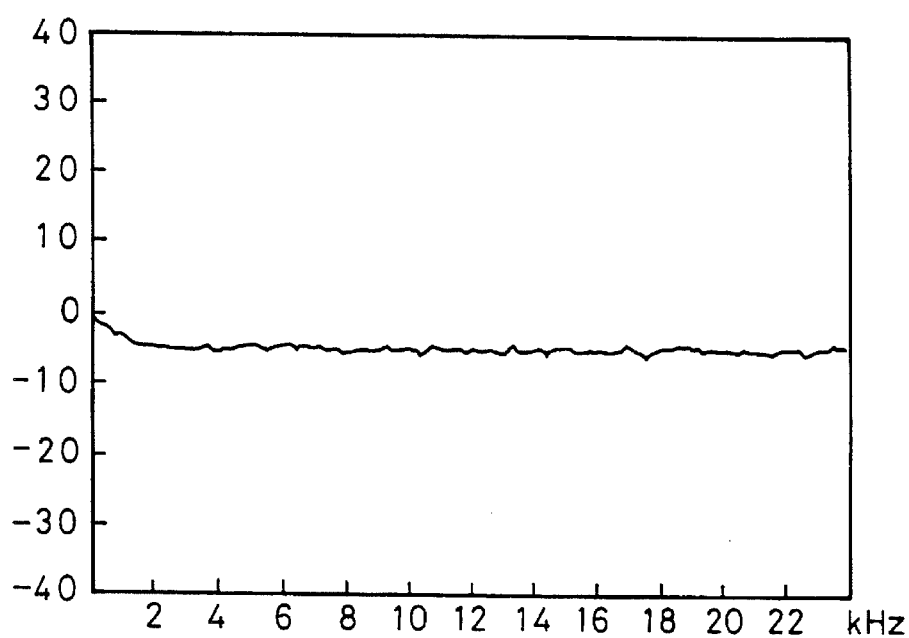
Figure 21:
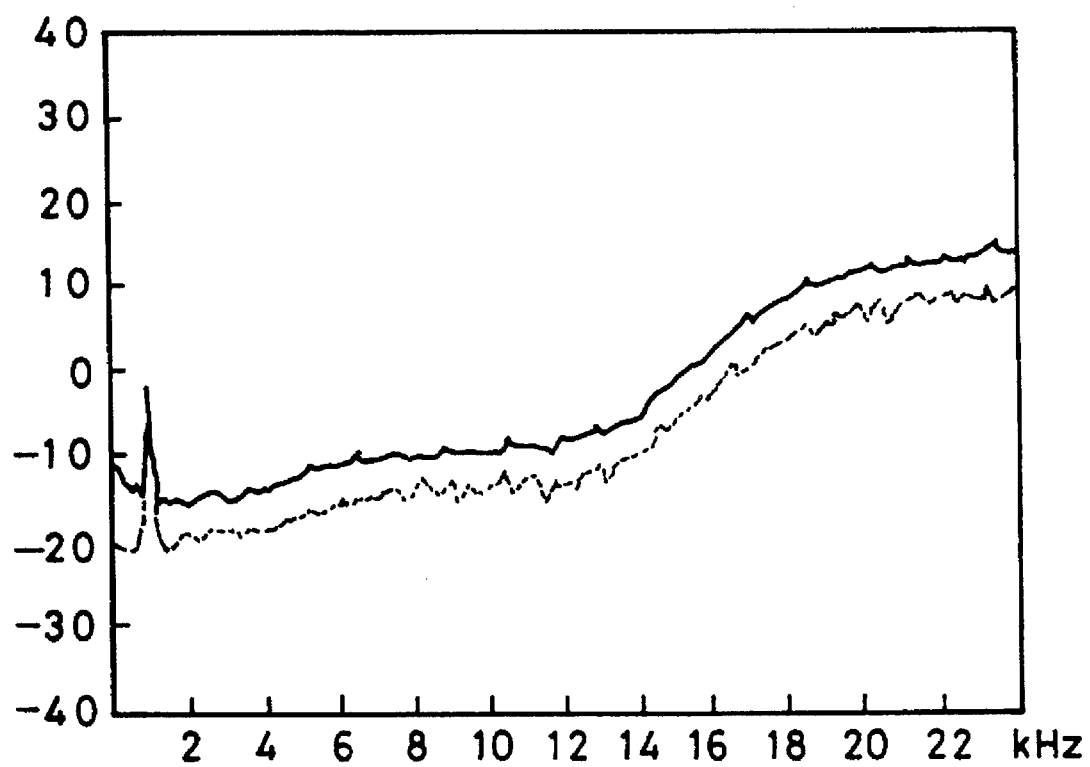
FIG. 21 is a spectrum chart showing a noise shaping quantization characteristic for a small-level signal according to the second embodiment.

For a possible case where the level of the input signal becomes smaller, FIG. 19 shows the amplitude distribution of the auto dither characteristic resulting from the simulation conducted with a sine wave having an amplitude of 2 (4 bits lower than the LSB) and FIG. 20 shows the spectrum. Even with such a small-level input signal, the dither generating apparatus embodying this invention functions properly. FIGS. 21 shows the spectrum characteristic when noise shaping characteristic quantization of this embodiment is carried out using this auto dither. As illustrated, even a signal whose level is smaller by four bits than the LSB is reproduced with a sufficient resolution.

Figure 22:
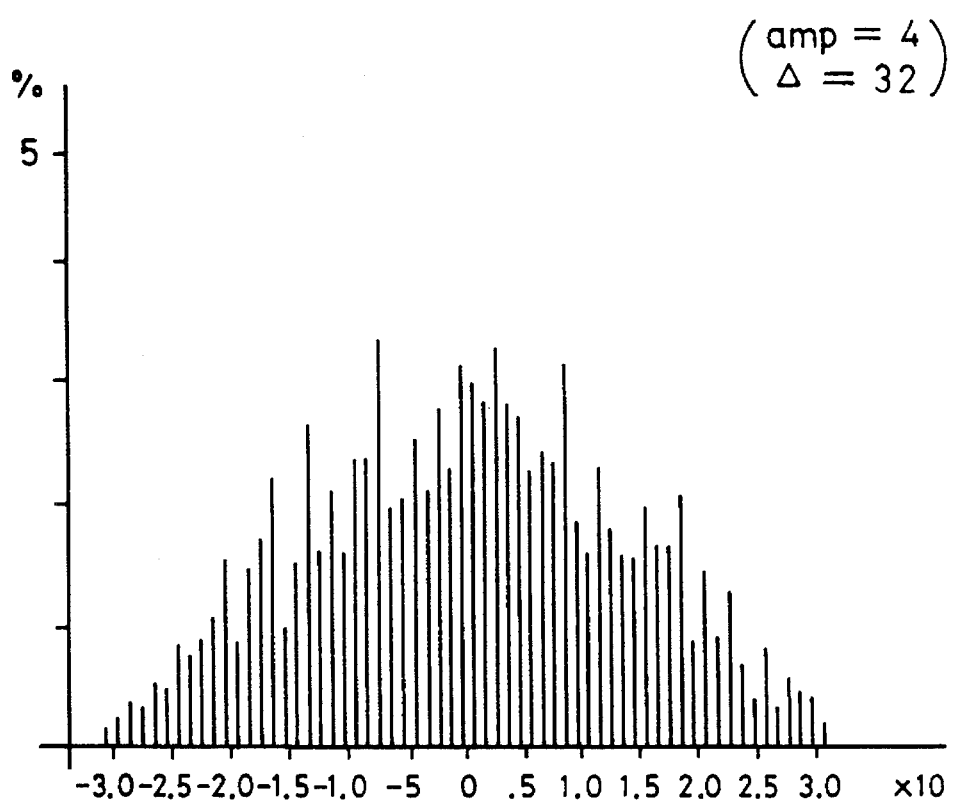
FIGS. 22 and 23 are diagrams showing the amplitude distribution and spectrum when the conventional auto dither generator is used in the second embodiment.
Figure 23:
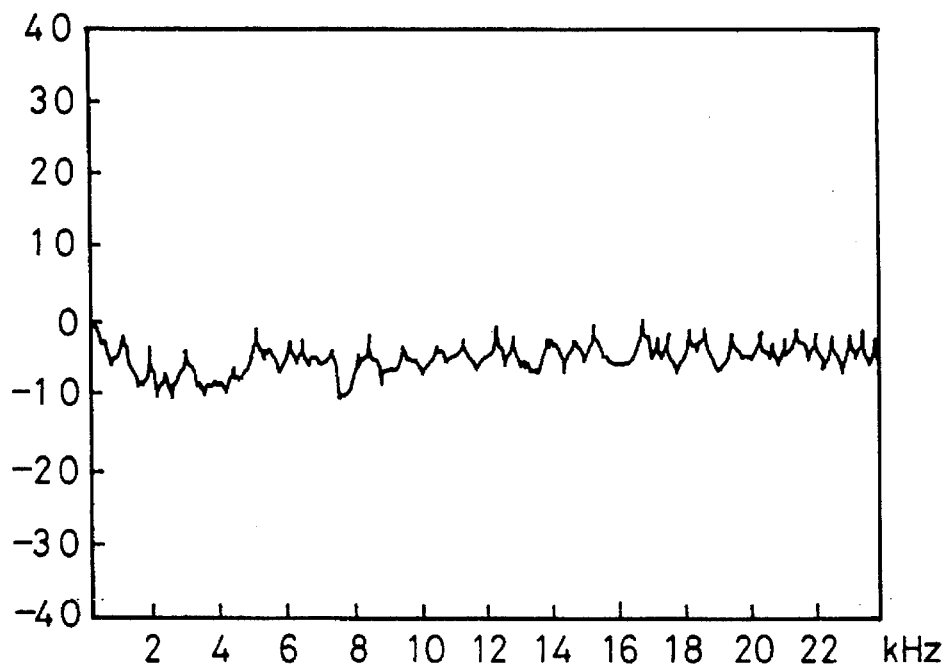
Figure 25:
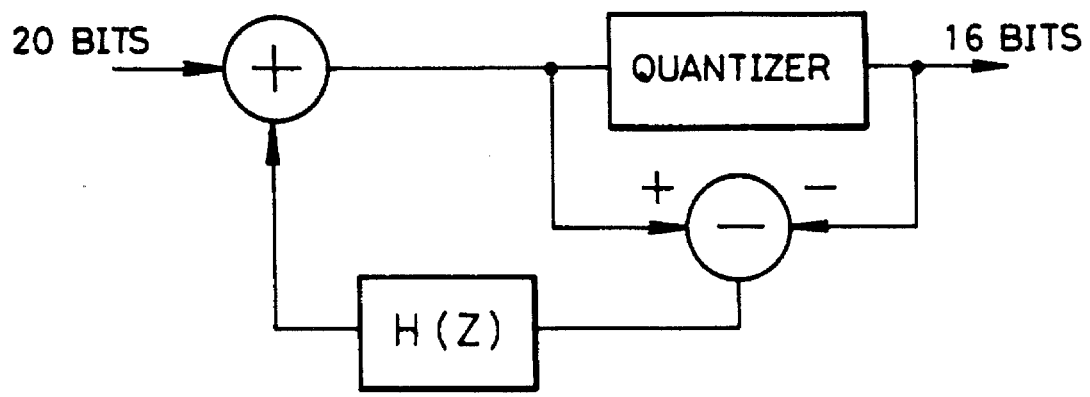
FIG. 25 is an explanatory diagram showing a super bit mapping.
Figure 26:
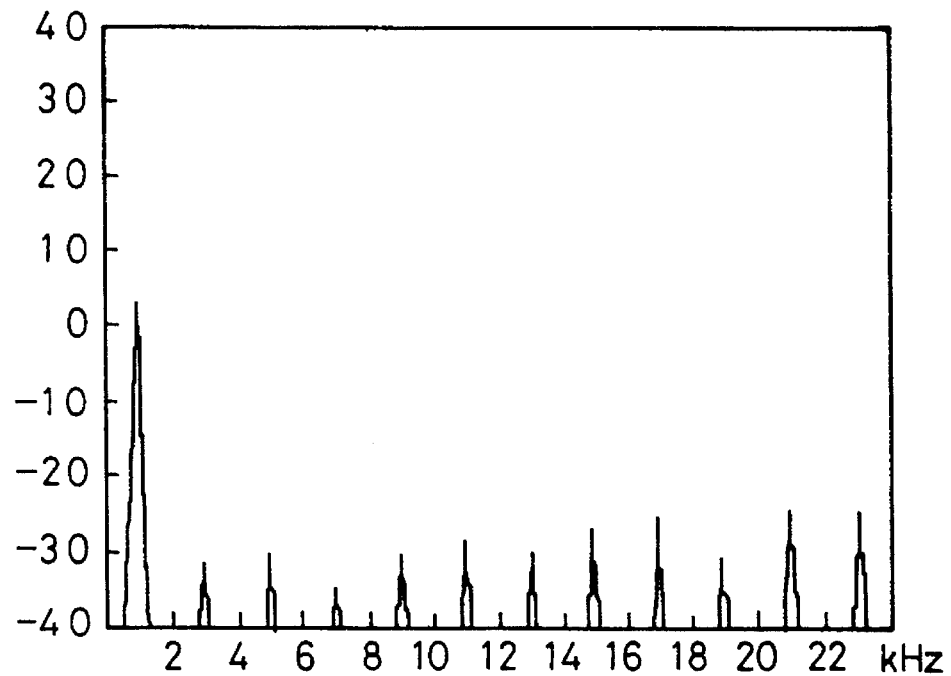
FIGS. 26 and 27 are spectrum charts for a stimulus number 0.
Figure 27:
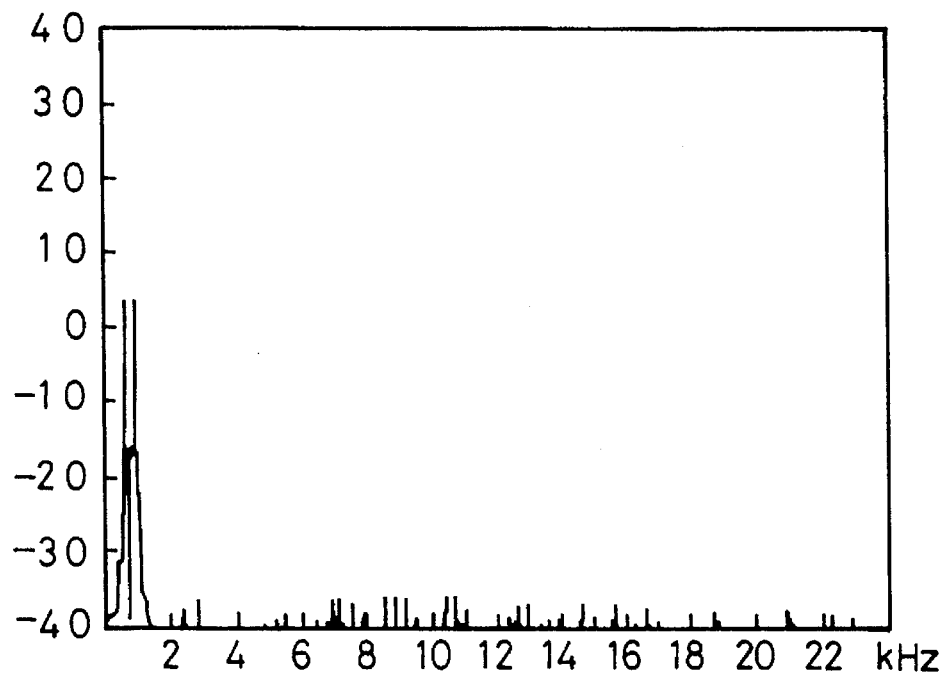
Figure 28:
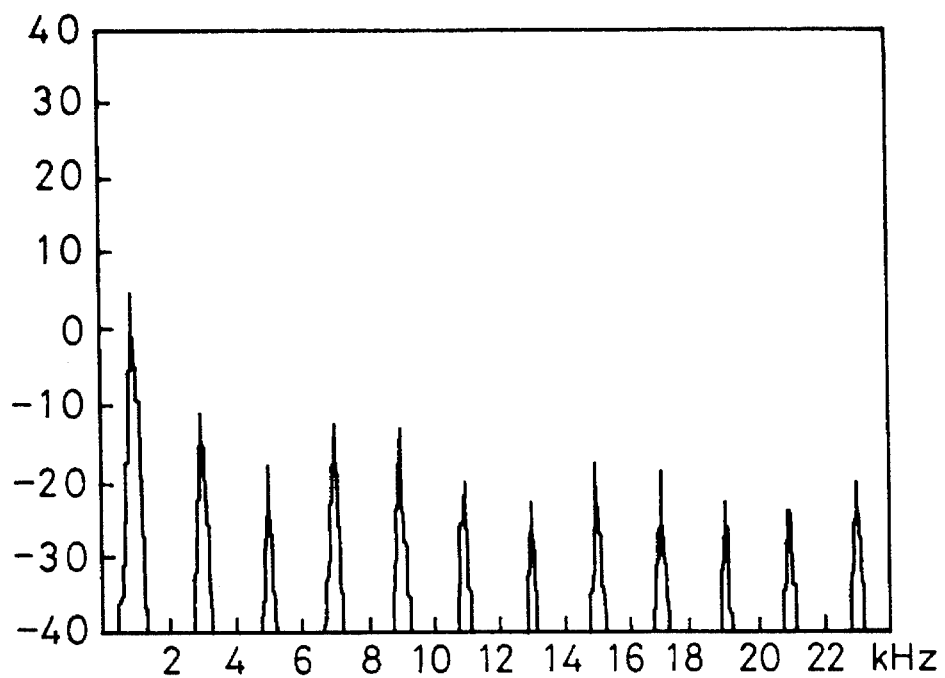
FIGS. 28 and 29 are spectrum charts for a stimulus number 1.
Figure 29:
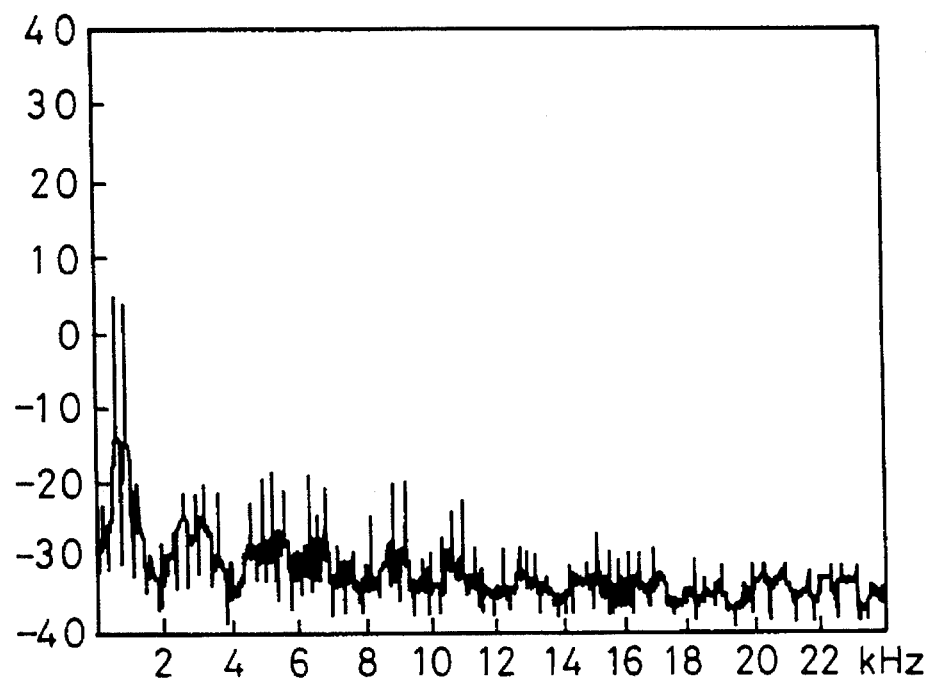
Figure 30:
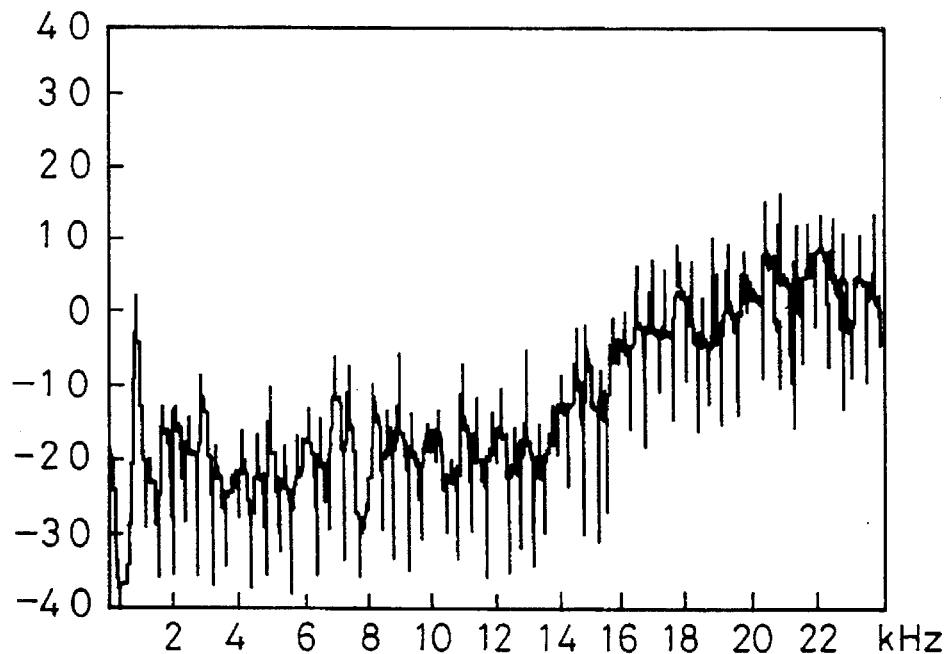
FIGS. 30 and 31 are spectrum charts for a stimulus number 2.
Figure 31:
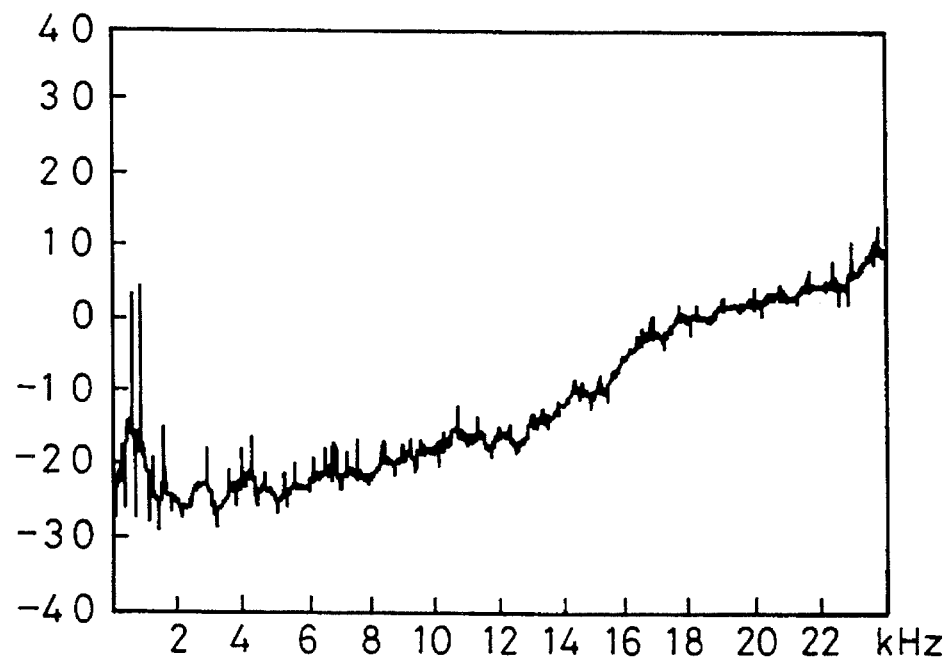
Figure 32:
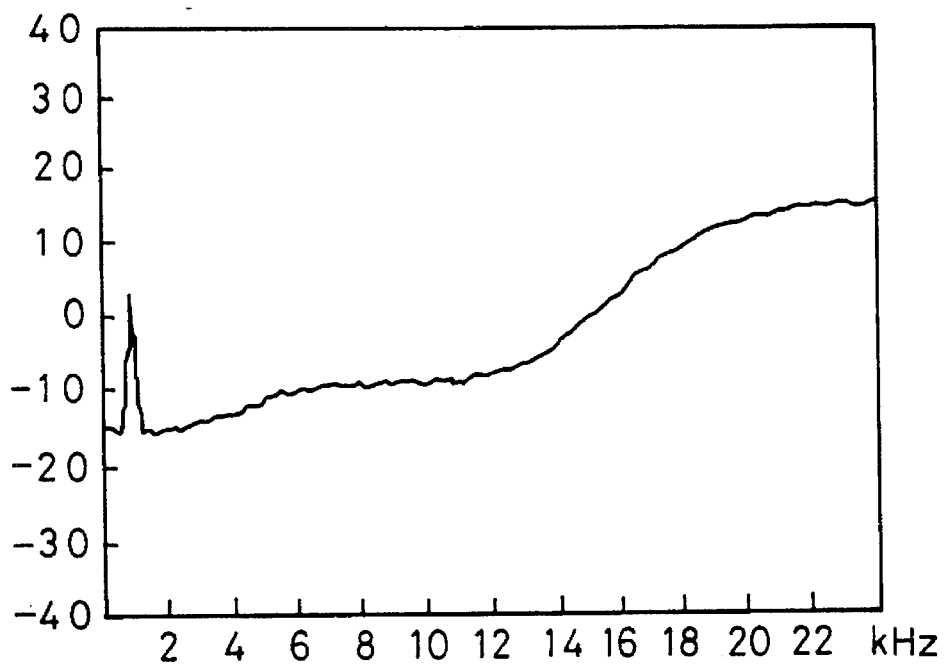
FIGS. 32 and 33 are spectrum charts for a stimulus number 3.
Figure 33:
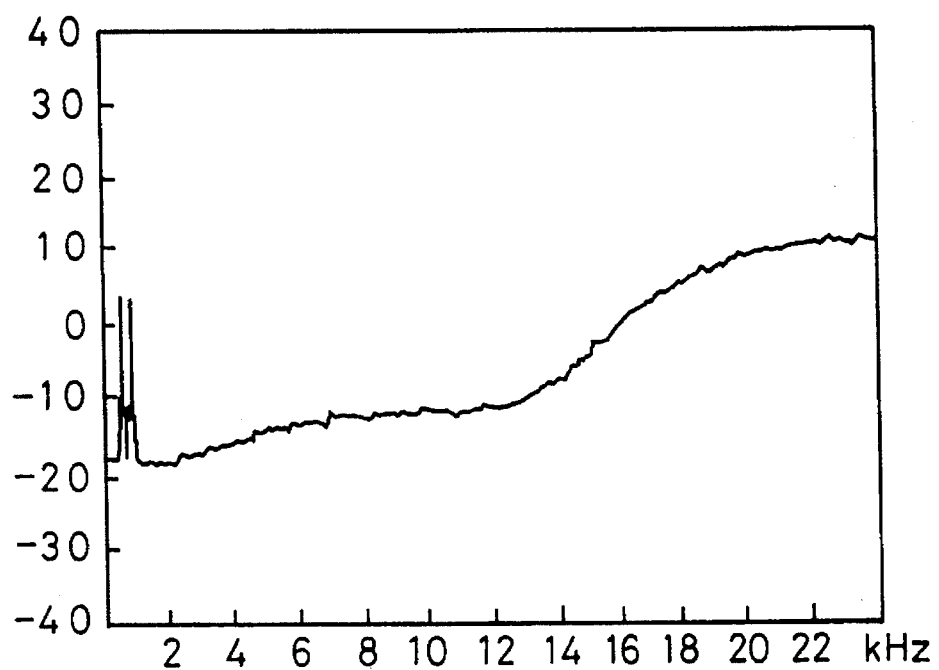
Figure 34:
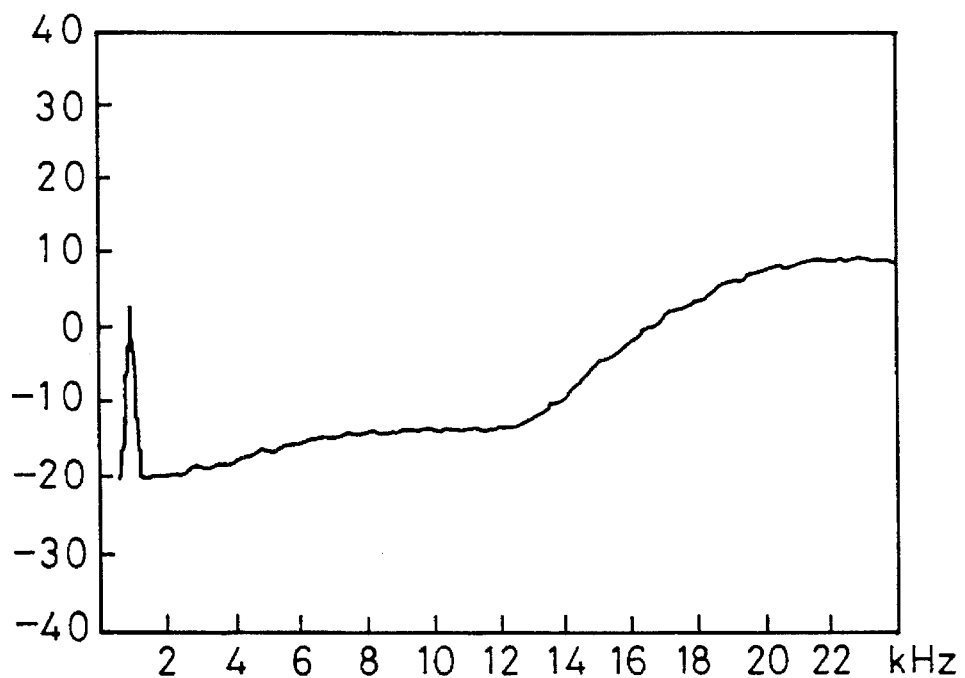
FIGS. 34 and 35 are spectrum charts for a stimulus number 4.
Figure 35:
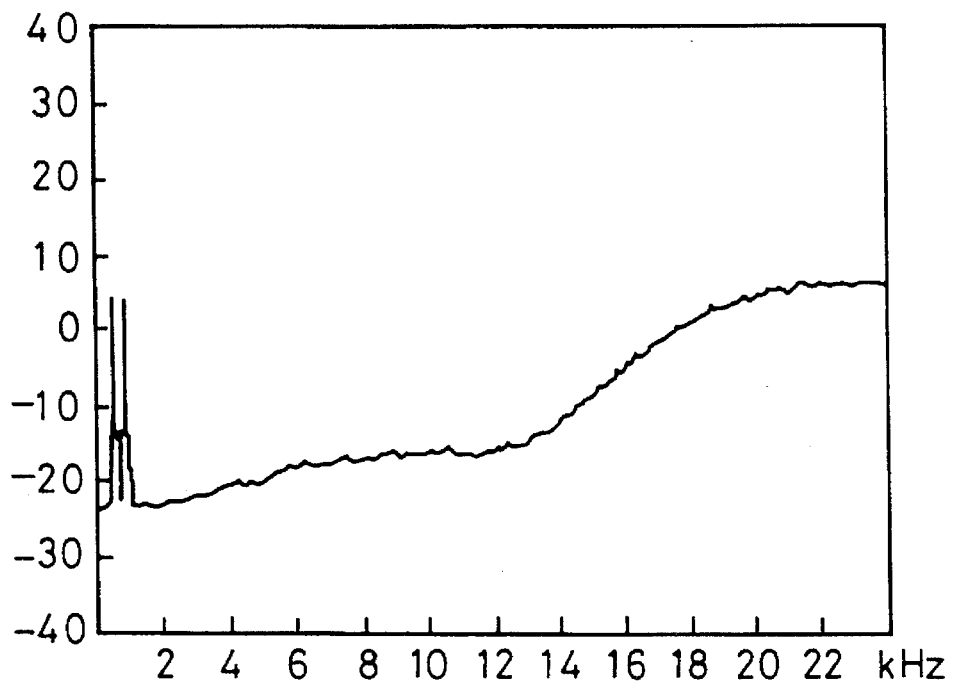
Figure 36:
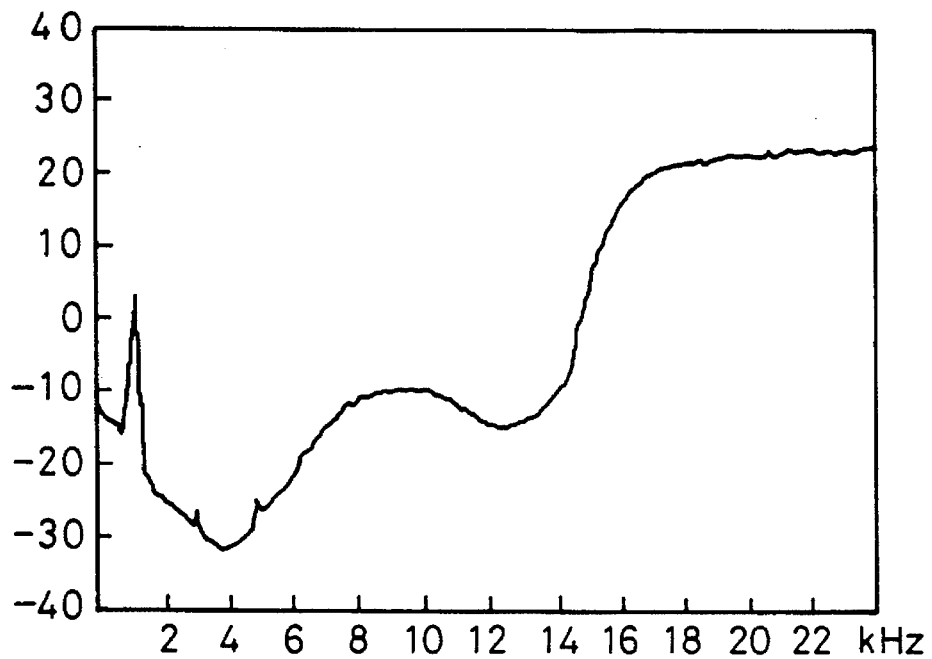
FIGS. 36 and 37 are spectrum charts for a stimulus number 5.
Figure 37:
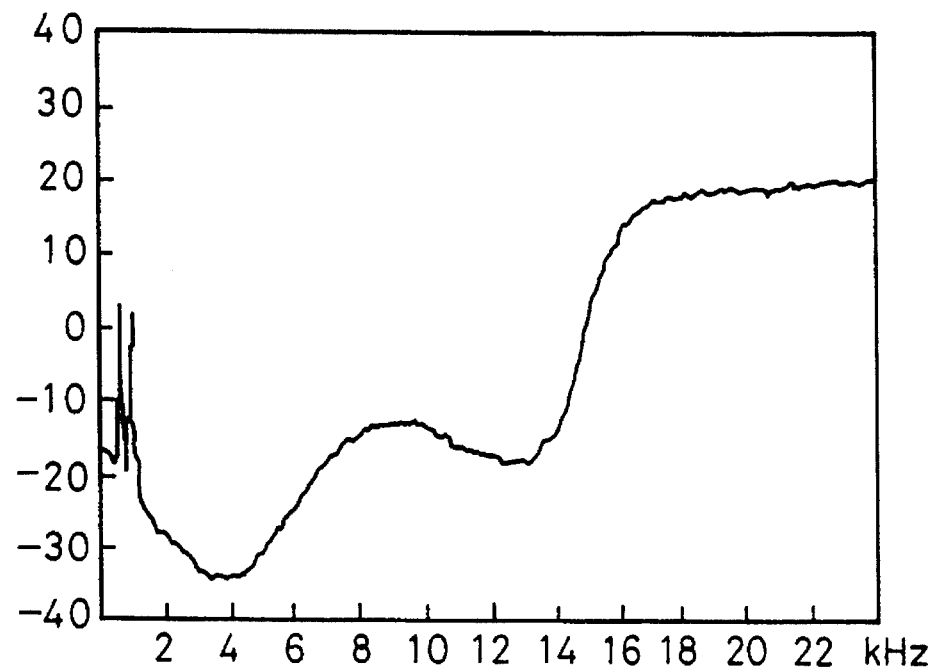
Figure 38:
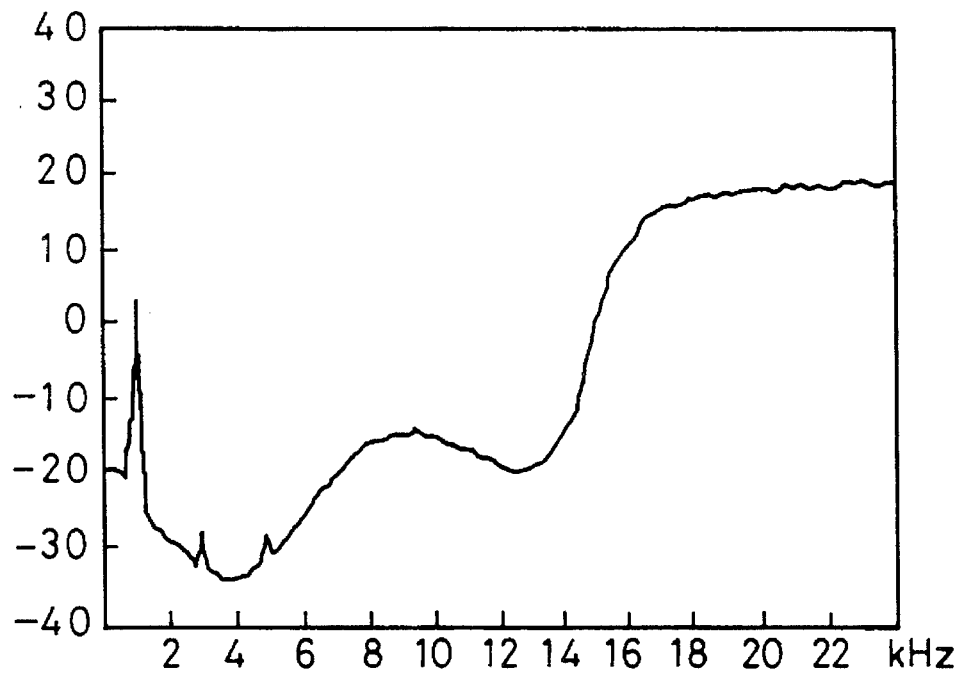
FIGS. 38 and 39 are spectrum charts for a stimulus number 6.
Figure 39:
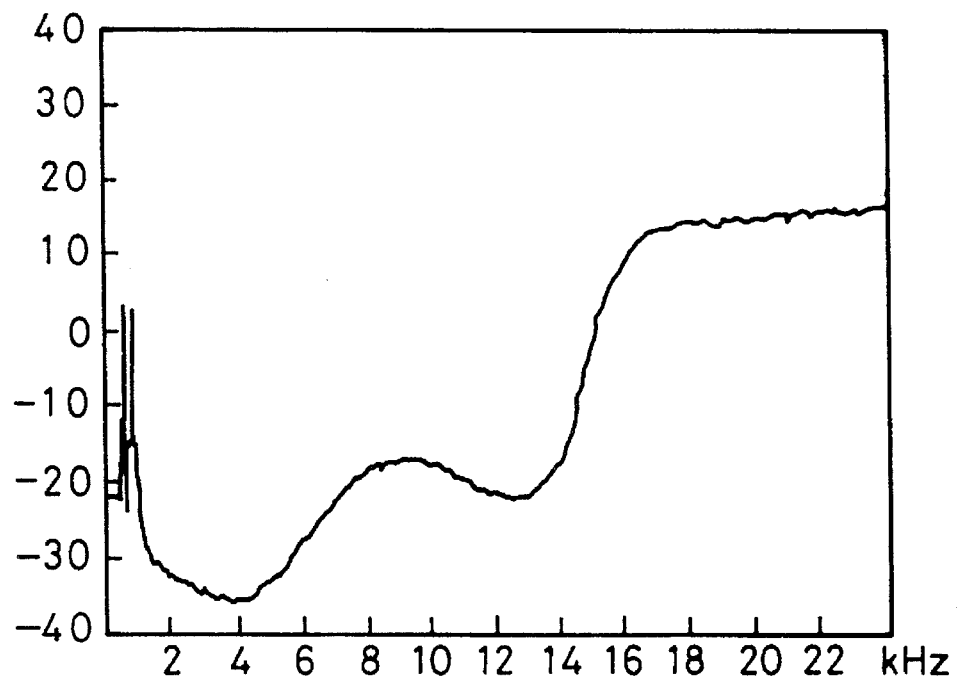

Of course, the conventional auto dither generating apparatus may be used in place of the auto dither generator 100 in the second embodiment, and FIGS. 22 and 23 show the characteristics for this case. As apparent from those diagrams, the amplitude distribution (FIG. 22) and the spectrum (FIG. 23) both do not have satisfactory characteristics, so that the possibility of using the conventional auto dither generator will be rejected.

According to the second embodiment, as described above, the combination of the auto dither generating apparatus embodying this invention and the noise shaping can reduce the audible quantization noise significantly.

Sound Test

The following describes the simulation results of sound testing according to the present invention.

(i) Test Conditions

FIGS. 24 through 42 show the results of the sound test conducted to evaluate the effects of the auto dither and noise shaping according to the present invention. The following two sound sources were used: the sound source 1 was selected to check the influence of harmonic deformation caused by the quantization and the sound source 2 was selected to check the influence of cross modulation.

(1) Sound source 1: 1 kHz sine wave with an amplitude of 4 (amp=4).

(2) Sound source 2: compound tone of 660 Hz sine wave with an amplitude of 4 and 1 kHz sine wave with an amplitude of 4.

The sounds from the sound sources 1 and 2 quantized with 16 bits were used as original signals from which stimuli were prepared with a quantization step Δ=32 (11 bits). To check the difference between the effects obtained by different shaping characteristics, the results of shaping executed with the shaping characteristic that is used in super bit mapping (SBM: FIG. 13) is compared with the results of shaping executed with the minimum audible threshold characteristic (MAF: FIG. 12). The super bit mapping is a signal process which is executed on the recording side to increase the resolution above the number of quantization bits, and the apparatus structure (FIG. 25) for this process is fundamentally the same as the one shown in FIG. 11. This process is used to quantize the original signal consisting of 20 bits to a 16-bit signal, for example. The difference from the second embodiment lies in that no dither is added.

There are two types of dithers, both being triangular auto dithers according to this invention: one dither involves subtraction and the other without it.

FIG. 24 shows a correlation table showing stimuli used in the tests and the diagram numbers. The stimulus 0 is the original signal and the stimulus 1 was used for comparison. In FIGS. 26 through 39, even-numbered diagrams show spectra for the sound source 1, and odd-numbered diagrams show spectra for the sound source 2.

Figure 40:
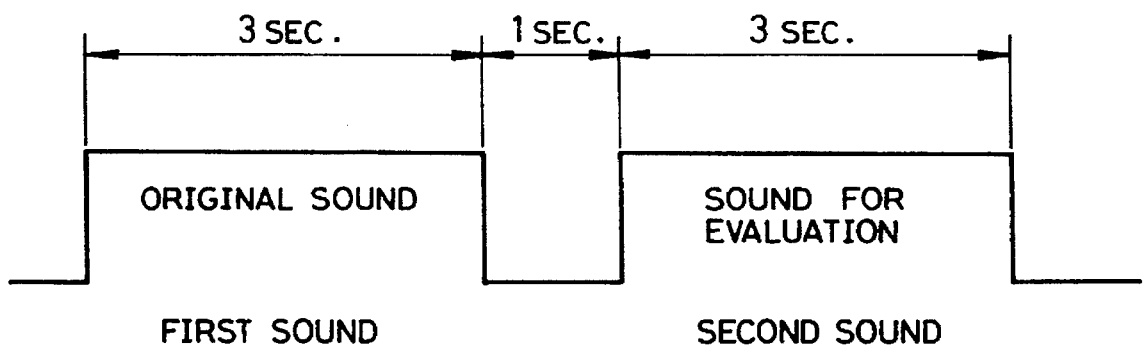
FIG. 40 is a diagram illustrating how to give a stimulus.

In the tests, each stimulus continued three seconds with one second interval to the next stimulus as shown in FIG. 40. The first sound is always the original signal (stimulus 0) and the second sound is any one of stimuli 0 to 6 selected at random.

The subjects who underwent the tests were asked to select one of the following five evaluations on the deterioration of the sound quality (noise amount and deformation amount) of the second sound with respect to the first sound based on the CCIR Rec. 562 standards.

5: feel no deterioration

4: feels deterioration which is negligible

3: slightly deteriorated

2: deteriorated

1: very deteriorated

Five subjects made four evaluations for each stimulus, a total of 20 evaluations.

(ii) Test Results

Figure 41:
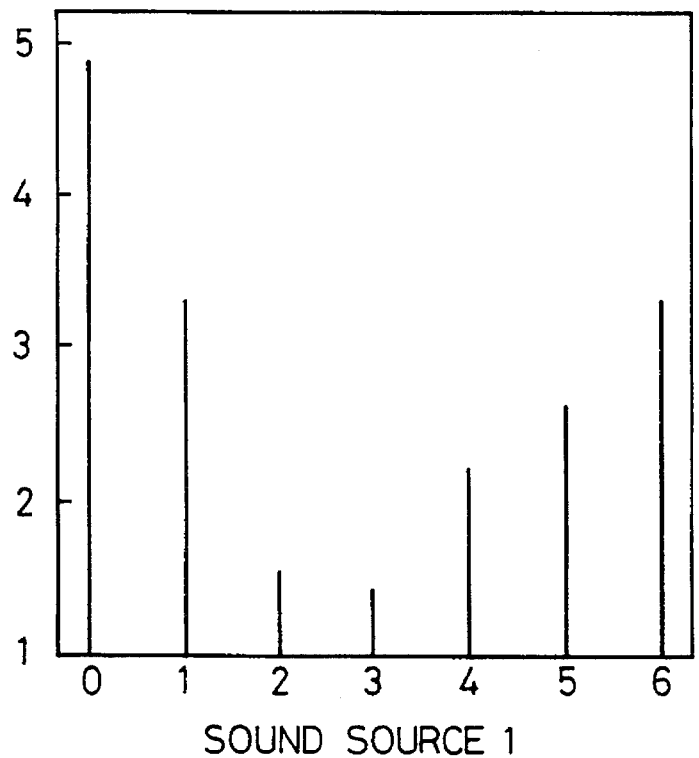
FIGS. 41 and 42 are explanatory diagrams showing the results of a sound testing experiment.
Figure 42:
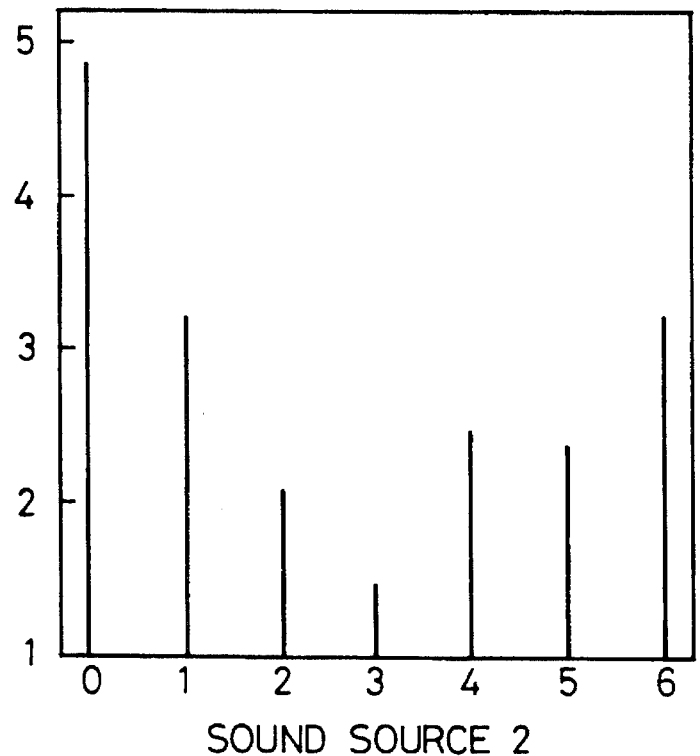

The average values of the evaluations done by the five subjects are illustrated in FIGS. 41 and 42. The numbers on the horizontal scale are stimulus numbers and those on the vertical scale are evaluation numbers.

From the comparison of the stimulus 2 with the stimulus 4, it is understood that even if the same noise shaping characteristic is used, the sound quality is improved by adding an auto dither and subtracting the auto dither from the output signal on the reproducing side as compared with the dither-less case. From the comparison of the stimulus 3 with the stimulus 4 and the stimulus 5 with the stimulus 6, it is apparent that the subtraction of the dither on the reproducing side reduces the feeling of noise. The difference between the stimulus 3 and the stimulus 4 and the difference between the stimulus 5 and the stimulus 6 come from the difference in noise shaping characteristic. Those comparisons show that noise feeling decreases when the noise frequency spectrum is matched with the minimum audible threshold. Without a dither or noise shaping, the signals from the sound source 1 and sound source 2 all become 0 through 11-bit quantization and cannot be reproduced. Therefore, the characteristics for the stimulus 2 to the stimulus 6 are much better than the simple 11-bit quantization.

According to the present invention, as described above, it is possible to generate good dithers from a subtractable auto dither which is produced from digital audio data itself, even when the level of the input signal is as low as about a half the quantization step. Further, the combination of the auto dither with noise shaping can allow excellent auto dithers to be generated even when the level of the input signal is lower by four bits than the quantization step.

In view of audibility, the subtractable auto dither and the noise shaping according to the present invention can apparently reduce the noise feeling and the deformation. In particular, the use of the noise shaping characteristic with the minimum audible threshold can provide the same performance as a simple quantization process which uses quantization bits greater in number by three bits.

What is claimed is:

1. A dither generating apparatus comprising:

extracting means for sequentially extracting a specific bit of each quantized digital data;

first memory means for storing M (M: a natural number) specific bits newly extracted by said extracting means, and shifting data associated with said specific bit, stored early, bit by bit every time a new specific bit is input;

second memory means for storing $2^M$ pieces of first M-bit data consisting of said M specific bits stored in said first memory means, and shifting said first M-bit data, stored previously, piece by piece every time said first M-bit data is input; and third memory means for storing $2^M$ random values in a row and outputting said random values as dithers for second M-bit data input from said second memory means, a value of said first M-bit data being input data stored in said second memory means and one piece of data from said stored $2^M$ M-bit data being used as an address for calling said second M-bit data.

* * * * *